(12) United States Patent
Choi

(10) Patent No.: US 12,175,932 B2
(45) Date of Patent: Dec. 24, 2024

(54) EMISSIVE DISPLAY DEVICE

(71) Applicant: Samsung Display Co., LTD., Yongin-si (KR)

(72) Inventor: Jong Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/101,031

(22) Filed: Jan. 24, 2023

(65) Prior Publication Data

US 2023/0317004 A1     Oct. 5, 2023

(30) Foreign Application Priority Data

Mar. 30, 2022   (KR) ........................ 10-2022-0039853

(51) Int. Cl.
    *G09G 3/3233*     (2016.01)
    *H10K 59/131*     (2023.01)

(52) U.S. Cl.
    CPC ......... *G09G 3/3233* (2013.01); *H10K 59/131* (2023.02); *G09G 2300/0408* (2013.01); *G09G 2300/0426* (2013.01); *G09G 2300/0819* (2013.01); *G09G 2300/0852* (2013.01); *G09G 2300/0861* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 8,115,707 B2 | 2/2012 | Nathan et al. | |
| 10,964,264 B1* | 3/2021 | Kim | G09G 3/3233 |
| 2010/0277455 A1* | 11/2010 | Miwa | G09G 3/3233 |
| | | | 345/211 |
| 2013/0207117 A1 | 8/2013 | An et al. | |
| 2016/0204182 A1* | 7/2016 | Son | H10K 59/131 |
| | | | 257/40 |
| 2018/0218676 A1* | 8/2018 | He | G09G 3/3275 |
| 2019/0278145 A1 | 9/2019 | Tanaka et al. | |
| 2021/0201782 A1* | 7/2021 | Jang | G09G 3/3233 |
| 2022/0173189 A1* | 6/2022 | Kim | H10K 59/1213 |

FOREIGN PATENT DOCUMENTS

| | | |
|---|---|---|
| KR | 10-2021-0011554 A | 2/2021 |
| KR | 10-2021-0013509 A | 2/2021 |
| KR | 10-2021-0057629 A | 5/2021 |
| KR | 10-2021-0085050 A | 7/2021 |

* cited by examiner

*Primary Examiner* — Nicholas J Lee

(74) *Attorney, Agent, or Firm* — Lewis Roca Rothgerber Christie LLP

(57) ABSTRACT

A display device includes: a light emitting diode; a driving transistor outputting current to the light emitting diode, the driving transistor being p-type and comprising a gate electrode, a first electrode, and a second electrode; a second transistor that is p-type and comprising a gate electrode, a first electrode, and a second electrode; a third transistor that is n-type and comprising a gate electrode, a first electrode, and a second electrode; a storage capacitor comprising a first electrode and a second electrode; and a hold capacitor, the second electrode of the third transistor being connected to the first electrode of the driving transistor, the first electrode of the second transistor being configured to receive a data voltage, and the second electrode of the second transistor being connected to the first electrode of the third transistor, the first electrode of the storage capacitor, and the second electrode of the hold capacitor.

20 Claims, 32 Drawing Sheets

EMISSIVE DISPLAY DEVICE

CROSS-REFERENCE TO RELATED APPLICATION

The present application claims priority to and the benefit of Korean Patent Application No. 10-2022-0039853, filed in the Korean Intellectual Property Office on Mar. 30, 2022, the entire content of which is incorporated herein by reference.

BACKGROUND

1. Field

Aspects of some embodiments of the present disclosure relate to an emissive display device.

2. Description of the Related Art

A display device includes a screen or display panel for displaying images, and includes a liquid crystal display, an organic light emitting diode display, and the like. Such a display device may be used in various electronic devices such as mobile phones, navigation units, digital cameras, electronic books, portable game machines, and various terminals.

A display device such as an organic light emitting diode display may have a structure in which the display device can be bent or folded using a flexible substrate. Additionally, a structure of a pixel used in the organic light emitting diode display may influence the performance and display quality of the display device.

The above information disclosed in this Background section is only for enhancement of understanding of the background and therefore the information discussed in this Background section does not necessarily constitute prior art.

SUMMARY

Aspects of some embodiments of the present disclosure relate to an emissive display device, and for example, to an emissive display device including a pixel having a new circuit structure.

Aspects of some embodiments include an emissive display device including a pixel having a new circuit structure.

Aspects of some embodiments include an emissive display device including: a light emitting diode; a driving transistor configured to generate an output current transferred to the light emitting diode, to include a gate electrode, a first electrode, and a second electrode, and to be formed by using a p-type transistor; a second transistor configured to include a gate electrode, a first electrode, and a second electrode, and to be formed by using a p-type transistor; a third transistor configured to include a gate electrode, a first electrode, and a second electrode, and to be formed by using an n-type transistor; a storage capacitor configured to include a first electrode and a second electrode; and a hold capacitor configured to include a first electrode and a second electrode, wherein the second electrode of the third transistor is connected to the first electrode of the driving transistor, the first electrode of the second transistor receives a data voltage, and the second electrode of the second transistor is connected to the first electrode of the third transistor, the first electrode of the storage capacitor, and the second electrode of the hold capacitor.

According to some embodiments, the emissive display device may further include a fourth transistor configured to include a gate electrode, a first electrode, and a second electrode, and to be formed by using an n-type transistor; and a fifth transistor configured to include a gate electrode, a first electrode, and a second electrode, and to be formed by using a p-type transistor, wherein the second electrode of the fourth transistor may be connected to the gate electrode of the driving transistor and the second electrode of the storage capacitor, and the second electrode of the fifth transistor may be connected to the first electrode of the driving transistor and the second electrode of the third transistor.

According to some embodiments, the emissive display device may further include a sixth transistor configured to include a gate electrode, a first electrode, and a second electrode and to be formed by using a p-type transistor, and the first electrode of the sixth transistor may be connected to the second electrode of the driving transistor.

According to some embodiments, the emissive display device may further include a seventh transistor configured to include a gate electrode, a first electrode, and a second electrode, and the second electrode of the seventh transistor may be connected to one electrode of the light emitting diode.

According to some embodiments, the emissive display device may further include an eighth transistor configured to include a gate electrode, a first electrode, and a second electrode, and the second electrode of the eighth transistor may be connected to the first electrode of the driving transistor and the second electrode of the third transistor.

According to some embodiments, the emissive display device may further include a ninth transistor configured to include a gate electrode, a first electrode, and a second electrode, and the second electrode of the ninth transistor may be connected to the second electrode of the driving transistor.

According to some embodiments, the driving transistor further includes an additional gate electrode, and the additional gate electrode of the driving transistor may be connected to the first electrode of the driving transistor.

Aspects of some embodiments of the present disclosure include an emissive display device including: a light emitting diode; a driving transistor configured to generate an output current transferred to the light emitting diode, to include a gate electrode, a first electrode, and a second electrode, to be formed by using an n-type transistor; a second transistor configured to include a gate electrode, a first electrode, and a second electrode, and to be formed by using an n-type transistor; a third transistor configured to include a gate electrode, a first electrode, and a second electrode, and to be formed by using an n-type transistor; a storage capacitor configured to include a first electrode and a second electrode; and a hold capacitor configured to include a first electrode and a second electrode, wherein the second electrode of the third transistor is connected to the second electrode of the driving transistor, the first electrode of the second transistor receives a data voltage, and the second electrode of the second transistor is connected to the first electrode of the third transistor, the first electrode of the storage capacitor, and the second electrode of the hold capacitor.

According to some embodiments, the emissive display device may further include a fourth transistor configured to include a gate electrode, a first electrode, and a second electrode and to be formed by using an n-type transistor, and the second electrode of the fourth transistor may be connected to the gate electrode of the driving transistor and the second electrode of the storage capacitor.

According to some embodiments, the emissive display device may further include a fifth transistor configured to include a gate electrode, a first electrode, and a second electrode, and to be formed by using an n-type transistor; and a sixth transistor configured to include a gate electrode, a first electrode, and a second electrode and to be formed by using an n-type transistor, wherein the second electrode of the fifth transistor may be connected to the first electrode of the driving transistor, and the first electrode of the sixth transistor may be connected to the second electrode of the driving transistor and the second electrode of the third transistor.

According to some embodiments, the emissive display device may further include a seventh transistor configured to include a gate electrode, a first electrode, and a second electrode, and the second electrode of the seventh transistor may be connected to one electrode of the light emitting diode.

According to some embodiments, the emissive display device may further include an eighth transistor configured to include a gate electrode, a first electrode, and a second electrode, and the second electrode of the eighth transistor may be connected to the first electrode of the driving transistor.

According to some embodiments, the emissive display device may further include a ninth transistor configured to include a gate electrode, a first electrode, and a second electrode, and the second electrode of the ninth transistor may be connected to the second electrode of the driving transistor and the second electrode of the third transistor.

According to some embodiments, the driving transistor further includes an additional gate electrode, and the additional gate electrode of the driving transistor may be connected to the second electrode of the driving transistor.

Aspects of some embodiments according to the present disclosure include an emissive display device including: a substrate; a first semiconductor layer on the substrate and configured to include a first portion including a semiconductor of a driving transistor and a second portion separated from the first portion and including a semiconductor of a second transistor; a first gate insulating layer on the first semiconductor layer; a first gate conductive layer on the first gate insulating layer and configured to include a gate electrode of the driving transistor and a gate electrode of the second transistor; a second gate insulating layer on the first gate conductive layer; a second gate conductive layer on the second gate insulating layer and configured to include a first storage electrode overlapping the gate electrode of the driving transistor, and a driving voltage line including an extension; a first interlayer insulating layer on the second gate conductive layer; a second semiconductor layer on the first interlayer insulating layer and configured to include a semiconductor of a third transistor and a second electrode of a hold capacitor overlapping the extension of the driving voltage line; a third gate insulating layer on the second semiconductor layer; a third gate conductive layer on the third gate insulating layer and configured to include a gate electrode of the third transistor; a second interlayer insulating layer on the third gate conductive layer; and a first data conductive layer on the second interlayer insulating layer and configured to include a first node connecting member and a semiconductor layer connecting member, wherein a first end of the first portion of the first semiconductor layer and a first end of the second semiconductor layer are connected to each other by the semiconductor layer connecting member, and a second end of the second semiconductor layer and a first end of the second portion of the first semiconductor layer are connected to each other by the first node connecting member.

According to some embodiments, the first node connecting member may also be connected to the first storage electrode and the second electrode of the hold capacitor.

According to some embodiments, the second semiconductor layer may further include a semiconductor of a fourth transistor, the third gate conductive layer may further include a gate electrode of the fourth transistor, and the first storage electrode may have an opening, and the gate electrode of the driving transistor may be connected to the semiconductor of the fourth transistor through the opening of the first storage electrode.

According to some embodiments, the first portion of the first semiconductor layer may further include a semiconductor of a fifth transistor and a semiconductor of a sixth transistor, the first gate conductive layer may further include a gate electrode of the fifth transistor and a gate electrode of the sixth transistor, the first data conductive layer may further include a driving voltage connecting member, and the second electrode of the hold capacitor has an opening, and the extension of the driving voltage line may be connected to the semiconductor of the fifth transistor through the driving voltage connecting member through the opening of the second electrode of the hold capacitor.

According to some embodiments, the second semiconductor layer may further include a semiconductor of a seventh transistor, the third gate conductive layer may further include a gate electrode of the seventh transistor, and the semiconductor of the seventh transistor may be connected to the semiconductor of the sixth transistor.

According to some embodiments, the emissive display device may further include: a first organic layer on the first data conductive layer; and a second data conductive layer on the first organic layer and configured to include a vertical driving voltage line and a data line, wherein the vertical driving voltage line may be connected to the driving voltage connecting member, and the data line may be connected to the semiconductor of the second transistor.

According to some embodiments, it may be possible to provide an emissive display device including a pixel that performs compensation and operates in a new way.

DETAILED DESCRIPTION

Figure 1:
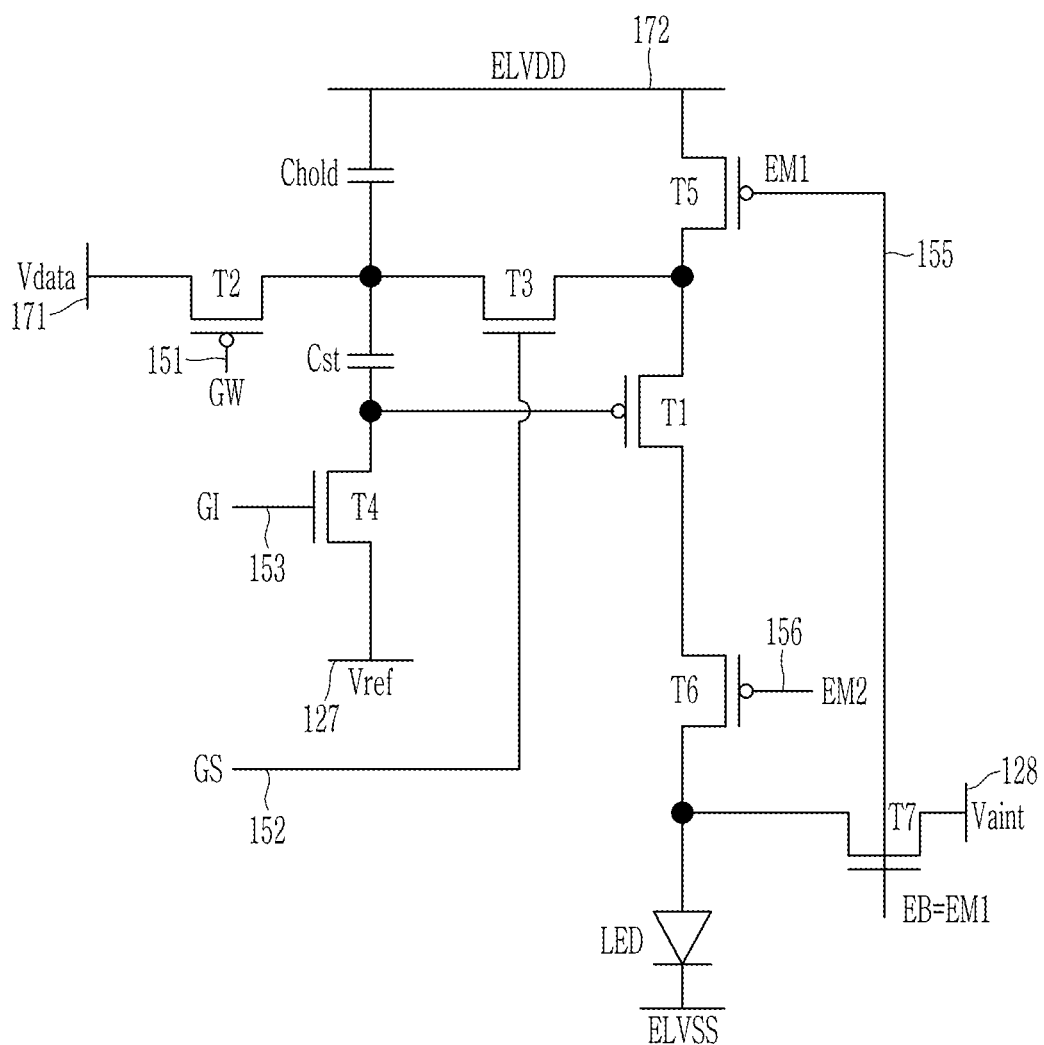
FIG. 1 illustrates an equivalent circuit diagram of a pixel included in an emissive display device according to some embodiments.

Aspects of some embodiments of the present invention will be described more fully hereinafter with reference to the accompanying drawings, in which some embodiments of the invention are shown. As those skilled in the art would realize, the described embodiments may be modified in various different ways, all without departing from the spirit or scope of the present invention.

To clearly describe the present invention, parts that are irrelevant to the description may be omitted, and like numerals refer to like or similar constituent elements throughout the specification.

Further, because sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In addition, throughout the specification, when it is said that a portion of a wire, layer, film, region, plate, component, etc., "extends in a first direction or a second direction," this does not indicate only a straight shape extending straight in the corresponding direction, and indicates a structure that generally extends along the first direction or the second direction, and it includes a structure that is bent at a portion, has a zigzag structure, or extends while including a curved structure.

In addition, an electronic device (e.g., a mobile phone, TV, monitor, notebook computer, etc.) including a display device, a display panel, etc. described in the specification, or an electronic device including a display device and a display panel manufactured by the manufacturing method described in the specification, are not excluded from the scope of the present specification.

First, a circuit structure of a pixel according to some embodiments including an n-type transistor and a p-type transistor will be described with reference to FIG. 1.

FIG. 1 illustrates an equivalent circuit diagram of a pixel included in an emissive display device according to some embodiments.

One pixel according to FIG. 1 includes a plurality of transistors T1, T2, T3, T4, T5, T6, and T7, a storage capacitor Cst, a hold capacitor Chold, and a light emitting diode LED which are connected to wires 127, 128, 151, 152, 153, 155, 156, 157, 171, and 172. Herein, the transistors and the capacitor excluding the light emitting diode LED may constitute a pixel circuit unit, and one pixel may include the pixel circuit unit and the light emitting diode. The transistors T1, T2, T3, T4, T5, T6, and T7 may be divided into an n-type transistor and a p-type transistor. According to some embodiments, the p-type transistor may be formed of a polycrystalline semiconductor transistor including a polycrystalline semiconductor, and the n-type transistor may be formed of an oxide semiconductor transistor including an oxide semiconductor. The driving transistor T1, the second transistor T2, and the fifth transistor T5 may be provided as the p-type transistor, and the third transistor T3, the fourth transistor T4, and the seventh transistor T7 may be provided as the n-type transistor. Herein, the n-type transistor may be a transistor turned on when a relatively high voltage is applied to a gate electrode, and the p-type transistor may be a transistor turned on when a relatively low voltage is applied to the gate electrode.

The wires 127, 128, 151, 152, 153, 155, 156, 171, and 172 are connected to one pixel PX. The wires include a reference voltage line 127, an initialization voltage line 128, a first scan line 151, a second scan line 152, a third scan line 153, a first emission control line 155, a second emission control line 156, a data line 171, and a driving voltage line 172. Additionally, a common voltage line transferring a driving low voltage ELVSS may be connected to one side of the light emitting diode LED.

The first scan line 151 transmits a first scan signal GW to the second transistor T2. The second scan line 152 transmits a second scan signal GS to the third transistor T3. The third scan line 153 transfers a third scan signal GI to the fourth transistor T4, the first emission control line 155 transfers a first emission control signal EM1 to the fifth transistor T5 and the seventh transistor T7, and the second emission control line 156 transmits a second emission control signal EM2 to the sixth transistor T6.

The data line 171 is a line that transfers the data voltage Vdata generated by the data driver, and accordingly, a magnitude of the emission current transferred to the light emitting diode LED is changed, so that luminance of the light emitting diode LED is also changed. The driving voltage line 172 applies a driving voltage ELVDD. The reference voltage line 127 transfers a reference voltage Vref, and the initialization voltage line 128 transfers an initialization voltage Vaint. According to some embodiments, voltages applied to the driving voltage line 172, the reference voltage line 127, and the initialization voltage line 128 may each be a constant voltage.

The driving transistor T1 (also referred to as a first transistor) is a p-type transistor and has a silicon semiconductor (polycrystalline semiconductor) as a semiconductor layer. It is a transistor that adjusts a magnitude of an emission current outputted to one electrode of the light emitting diode LED depending on a magnitude of a voltage of a gate electrode of the driving transistor T1 (that is, a voltage stored in the storage capacitor Cst). A brightness of the light emitting diode LED may be adjusted depending on the magnitude of the emission current outputted to one electrode of the light emitting diode LED, and thus emission luminance of the light emitting diode LED may be adjusted depending on a data voltage Vdata applied to the pixel. For this purpose, a first electrode of the driving transistor T1 is connected to the driving voltage line 172 via the fifth transistor T5 by being positioned to receive the driving voltage ELVDD.

In addition, the first electrode of the driving transistor T1 is also connected to a second electrode of the third transistor T3. The data voltage Vdata is applied to the first electrode of the driving transistor T1 through the second transistor T2 and the third transistor T3. Meanwhile, the second electrode of the driving transistor T1 outputs an emission current to the light emitting diode LED, and is connected to one electrode of the light emitting diode LED via the sixth transistor T6 (hereinafter also referred to as an output control transistor). Meanwhile, a gate electrode of the driving transistor T1 is connected to a first electrode (hereinafter referred to as a 'second storage electrode') of the storage capacitor Cst. Accordingly, the voltage of the gate electrode of the driving transistor T1 changes depending on a voltage stored in the storage capacitor Cst, and an emission current outputted by the driving transistor T1 changes accordingly. The storage capacitor Cst serves to maintain a voltage of the gate electrode of the driving transistor T1 to be constant during one frame. Meanwhile, a gate electrode of the driving transistor T1 may also be connected to the fourth transistor T4, to be initialized by receiving the reference voltage Vref.

The second transistor T2, which is a p-type transistor, has a silicon semiconductor as a semiconductor layer. The second transistor T2 is a transistor that receives the data voltage Vdata into the pixel. A gate electrode of the second transistor T2 may be connected to the first scan line 151. A first electrode of the second transistor T2 is connected to the data line 171. The second electrode of the second transistor T2 is connected to a first electrode of the third transistor T3, a first electrode of the storage capacitor Cst (hereinafter referred to as a 'first storage electrode'), and a second electrode of the hold capacitor Chold. Hereinafter, a node to which the second electrode of the second transistor T2, the first electrode of the third transistor T3, the first electrode of the storage capacitor Cst, and the second electrode of the hold capacitor Chold are connected is also called a first node. When the second transistor T2 is turned on by the negative voltage of the first scan signal GW transferred through the first scan line 151, the data voltage Vdata transferred through the data line 171 is transferred to the first electrode of the third transistor T3, and the data voltage Vdata is transferred to the first electrode of the driving transistor T1 through the third transistor T3.

The third transistor T3, which is an n-type transistor, has an oxide semiconductor as a semiconductor layer. The third transistor T3 electrically connects the first electrode of the driving transistor T1 and the second electrode of the second transistor T2. As a result, it is a transistor that allows the data voltage Vdata to be transferred to the first electrode of the driving transistor T1. A gate electrode of the third transistor T3 is connected to the second scan line 152, and a first electrode of the third transistor T3 is connected to the first node, to be connected to the second electrode of the second transistor T2, a first electrode of the storage capacitor Cst, and a second electrode of the hold capacitor Chold. A second electrode of the third transistor T3 is connected to the first electrode of the driving transistor T1 and a second electrode of the fifth transistor T5

The third transistor T3 is turned on by a positive voltage of the second scan signal GS transferred through the second scan line 152, so as to connect the first electrode of the driving transistor T1 and the second electrode of the second transistor T2.

The fourth transistor T4, which is an n-type transistor, has an oxide semiconductor as a semiconductor layer. The fourth transistor T4 serves to transfer the reference voltage Vref to the gate electrode of the driving transistor T1 and the second storage electrode of the storage capacitor Cst. A gate electrode of the fourth transistor T4 is connected to the third scan line 153, and a first electrode of the fourth transistor T4 is connected to the reference voltage line 127. A second electrode of the fourth transistor T4 is connected to the second storage electrode of the storage capacitor Cst and the gate electrode of the driving transistor T1. The fourth transistor T4 is turned on by a positive voltage of the third scan signal GI transferred through the third scan line 153, and in this case, the reference voltage Vref is transferred to the gate electrode of the driving transistor T1 and the second storage electrode of the storage capacitor Cst.

The fifth transistor T5 and the sixth transistor T6, which are p-type transistors, have a silicon semiconductor as a semiconductor layer.

The fifth transistor T5 serves to transfer the driving voltage ELVDD to the driving transistor T1. A gate electrode of the fifth transistor T5 is connected to the first emission control line 155, a first electrode of the fifth transistor T5 is connected to the driving voltage line 172, and a second electrode of the fifth transistor T5 is connected to the first electrode of the driving transistor T1.

The sixth transistor T6 serves to transfer an emission current outputted from the driving transistor T1 to the light emitting diode. A gate electrode of the sixth transistor T6 is connected to the second emission control line 156, a first electrode of the sixth transistor T6 is connected to the second electrode of the driving transistor T1, and a second electrode of the sixth transistor T6 is connected to one electrode of the light emitting diode LED.

The seventh transistor T7, which is an n-type transistor, has an oxide semiconductor as a semiconductor layer. The seventh transistor T7 serves to initialize an electrode of the light emitting diode LED. Hereinafter, the seventh transistor T7 is also referred to as a light emitting diode initialization transistor. A gate electrode of the seventh transistor T7 is connected to the first emission control line 155, a second electrode of the seventh transistor T7 is connected to one electrode of the light emitting diode LED, and a first electrode of the seventh transistor T7 is connected to the initialization voltage line 128. When the seventh transistor T7 is turned on by a positive voltage of a first light emission control signal EM1 flowing through the first light emission control line 155, the initialization voltage Vaint is applied to one electrode of the light emitting diode LED to be initialized. According to some embodiments, both the fifth transistor T5 and the seventh transistor T7 receive the first light emission control signal EM1, but the two transistors are of different types, and thus when the fifth transistor T5 is turned on, the seventh transistor T7 is turned off, and when the seventh transistor T7 is turned on, the fifth transistor T5 may be turned off.

The first electrode of the storage capacitor Cst is connected to the first node, to be connected with the second electrode of the second transistor T2, the first electrode of the third transistor T3, and the second electrode of the hold capacitor Chold, and the second electrode thereof is connected to the gate electrode of the driving transistor T1 and the second electrode of the fourth transistor T4.

The first electrode of the hold capacitor Chold receives the driving voltage ELVDD, and the second electrode is connected to the first node to be connected to the second electrode of the second transistor T2, the first electrode of the third transistor T3, and the first electrode of the storage capacitor Cst.

Although it has been described that one pixel PX includes seven transistors T1 to T7 and two capacitors (storage capacitor Cst and hold capacitor Chold), the present disclosure is not limited thereto, and various modifications will be described with reference to FIG. 12 to FIG. 25.

In the above, a circuit structure of a pixel according to some embodiments has been described with reference to FIG. 1.

Hereinafter, a waveform of a signal applied to the pixel of FIG. 1 and an operation of the pixel depending on the waveform will be described with reference to FIG. 2.

Figure 2:
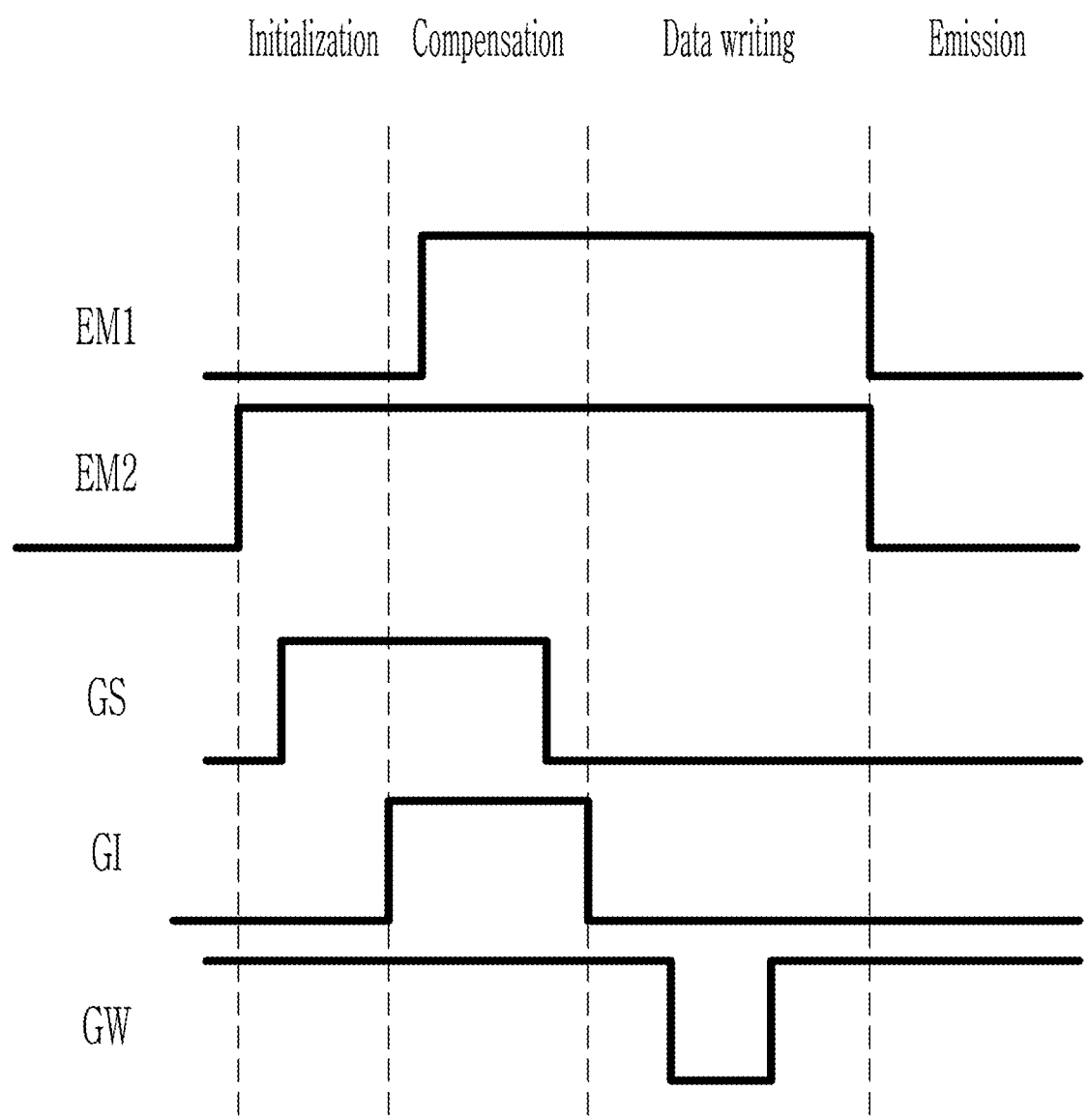
FIG. 2 illustrates a waveform diagram showing a signal applied to the pixel of FIG. 1 according to some embodiments.

FIG. 2 illustrates a waveform diagram showing a signal applied to the pixel of FIG. 1.

Referring to FIG. 2, when a signal applied to a pixel is divided into periods, it may be divided into an initialization period, a compensation period, a writing period, and an emission period. Meanwhile, a gate-on voltage and a gate-off voltage may be determined to be a high voltage or a low voltage depending on a type of transistor to which they are applied. That is, in a p-type transistor, the low voltage may be the gate-on voltage, and the high voltage may be the gate-off voltage, and in an n-type transistor, the high voltage may be the gate-on voltage, and the low voltage may be the gate-off voltage.

First, an emission period is a period in which the light emitting diode LED emits light, and a gate-on voltage (low level voltage) is applied in a first emission signal EM1 and a second emission signal EM2 to turn on the fifth transistor T5 and the sixth transistor T6. When the fifth transistor T5 is turned on so that the driving voltage ELVDD is transferred to the driving transistor T1, an output current is generated depending on a voltage of a gate electrode of the driving transistor T1. The output current of the driving transistor T1 is transmitted to the light emitting diode LED through the turned-on sixth transistor T6, to enable the light emitting diode LED to emit light. In FIG. 2, an emission period during which the first emission signal EM1 and the second emission signal EM2 apply the gate-on voltage (low level voltage) is hardly illustrated, but in reality, the emission period has a longest time. However, the emission period is simply illustrated in FIG. 2 without specific explanation because only the above simple operation is performed.

Meanwhile, in the embodiments illustrated with respect to FIG. 1, although the first emission signal EM1 is also transferred to the seventh transistor T7, unlike the fifth transistor T5, it is formed of an n-type transistor, and thus when the fifth transistor T5 is turned on, the seventh transistor T7 is turned off, and when the seventh transistor T7 is turned on, the fifth transistor T5 is turned off. Accordingly, the seventh transistor T7 is not turned on during the emission period.

When the emission period ends, the initialization period is entered.

As the second emission signal EM2 is changed to a gate-off voltage (high level voltage), the emission period ends. The initialization period is entered while the second scan signal GS is changed to a gate-on voltage (high level voltage), and in this case, the first emission signal EM1 and the third scan signal GI maintain a low level voltage.

During the initialization period, the third transistor T3 is turned on by the second scan signal GS, and the fifth transistor T5 is turned on by the first emission signal EM1. As a result, the driving voltage ELVDD is transferred to the second electrode of the fifth transistor T5, and is transferred to a first node through the third transistor T3. As a result, a voltage of a first electrode of the storage capacitor Cst and a voltage of a second electrode of the hold capacitor Chold are initialized to the driving voltage ELVDD. Therefore, the first electrode of the storage capacitor Cst has the driving voltage ELVDD, and opposite electrodes of the hold capacitor Chold have the driving voltage ELVDD.

When the initialization period ends, the compensation period is entered.

As the third scan signal GI is changed to the gate-on voltage (high level voltage), the initialization period ends and the compensation period is entered, and during the compensation period, the first emission signal EM1 is changed to the gate-off voltage (high level voltage). In this case, the second scan signal GS maintains the gate-on voltage (high level voltage). As a result, the fourth transistor T4 to which the third scan signal GI is applied is turned on to change a portion connected to the second electrode of the fourth transistor T4 (the second electrode of the storage capacitor Cst and the gate electrode of the driving transistor T1) to the reference voltage Vref. In this case, the reference voltage Vref may have a voltage value capable of turning on the driving transistor T1, and thus the driving transistor T1 may have a turn-on state during the compensation period. Thereafter, as the first emission signal EM1 is changed to the gate-off voltage (high level voltage), the fifth transistor T5 is turned off so that the driving voltage ELVDD is not transferred to the first node. In this case, the third transistor T3 is turned on by the second scan signal GS, and thus the driving voltage ELVDD stored in the first electrode of the storage capacitor Cst is reduced through the third transistor T3 and the driving transistor T1. When the voltage of the first electrode of the storage capacitor Cst decreases and the voltage of the first electrode of the driving transistor T1 is higher than the voltage of the gate electrode of the driving transistor T1 by a threshold voltage Vth, the driving transistor T1 is turned off. The voltage of the second electrode of the storage capacitor Cst has the reference voltage Vref, and thus the voltage of the first electrode of the storage capacitor Cst and the voltage of the first electrode of the driving transistor T1 may be higher than the reference voltage Vref by the threshold voltage Vth.

Meanwhile, during the compensation period, since the first emission signal EM1 is changed to a high level voltage, the seventh transistor T7 is turned on. As a result, the initialization voltage Vaint is transferred to one electrode of the light emitting diode LED to initialize it. For a period during which the initialization voltage Vaint is applied to one electrode of the light emitting diode LED, it may be applied during the writing period in addition to the compensation period.

When the compensation period ends, the writing period is entered.

As the second scan signal GS and the third scan signal GI are changed to the gate-off voltage, the compensation period ends and the writing period is entered. In this case, according to the embodiments illustrated with respect to FIG. 2, after the second scan signal GS is turned off, the third scan signal GI is turned off. Thereafter, the first scan signal GW is changed to a gate-on voltage (low level voltage), the second transistor T2 is turned on, and the data voltage Vdata is transferred to the first node.

A voltage value obtained by changing the voltage of the first node by the data voltage Vdata may be changed to Vdata−(Vref+Vth), and a voltage of the second electrode of the storage capacitor Cst may also be changed by a maximum value of Vdata−(Vref+Vth). As a result, a voltage value of the second electrode of the storage capacitor Cst may have a value of Vdata−Vth, and this value may be a voltage value of the gate electrode of the driving transistor T1. Vth among the voltage values of the gate electrode of the driving transistor T1 is used to turn on the driving transistor T1, and compensates for a different threshold voltage for each driving transistor T1. Only the data voltage Vdata, which is a remaining value among voltage values of the gate electrode of the driving transistor T1, is directly used by the driving transistor T1 to generate an output current.

When the writing period ends, the emission period is entered again.

That is, a gate-on voltage (low level voltage) is applied to the first emission signal EM1 and the second emission signal EM2 again, to turn on the fifth transistor T5 and the sixth transistor T6. When the fifth transistor T5 is turned on so that the driving voltage ELVDD is transferred to the driving transistor T1, an output current is generated depending on the voltage (i.e., data voltage Vdata) of the gate electrode of the driving transistor T1. The output current of the driving transistor T1 is transmitted to the light emitting diode LED through the turned-on sixth transistor T6, to enable the light emitting diode LED to emit light. In this case, the seventh transistor T7 is turned off due to the first light emitting signal EM1 to which a high level voltage value is applied so that the initialization voltage Vaint is not applied to one electrode of the light emitting diode LED, and only an output current of the driving transistor T1 is applied to one electrode of the light emitting diode LED.

In the above, the circuit structure and operation of the pixel have been described with reference to FIG. 1 and FIG. 2.

Hereinafter, the structure will be described in detail with reference to FIG. 3 to FIG. 10.

A planar structure of a pixel circuit unit in a pixel according to some embodiments will be described in more detail with reference to FIG. 3 to FIG. 10. That is, the light emitting diode LED is not illustrated in FIG. 3 to FIG. 9 below, but the structure of the pixel circuit unit positioned below the light emitting diode LED will be described.

FIG. 3 to FIG. 9 each illustrate a top plan view of each layer depending on a manufacturing order of an emissive display device according to some embodiments.

Figure 3:
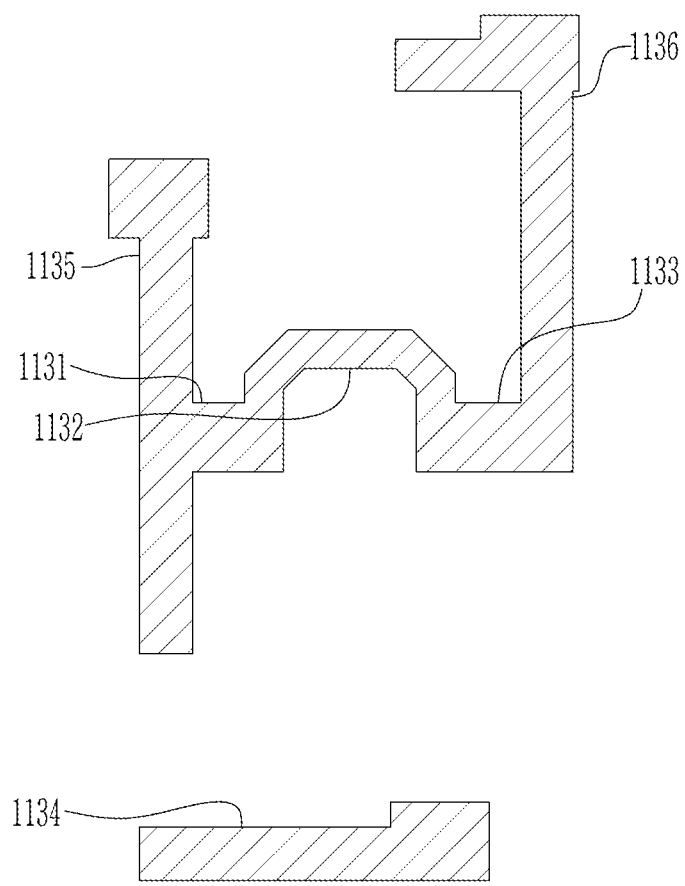
FIG. 3 to FIG. 9 each illustrate a top plan view of each layer depending on a manufacturing order of an emissive display device according to some embodiments.
Figure 3:
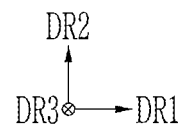

Referring to FIG. 3, a first semiconductor layer formed of a silicon semiconductor (e.g., polycrystalline semiconductor) is positioned on the substrate 110.

Figure 10:
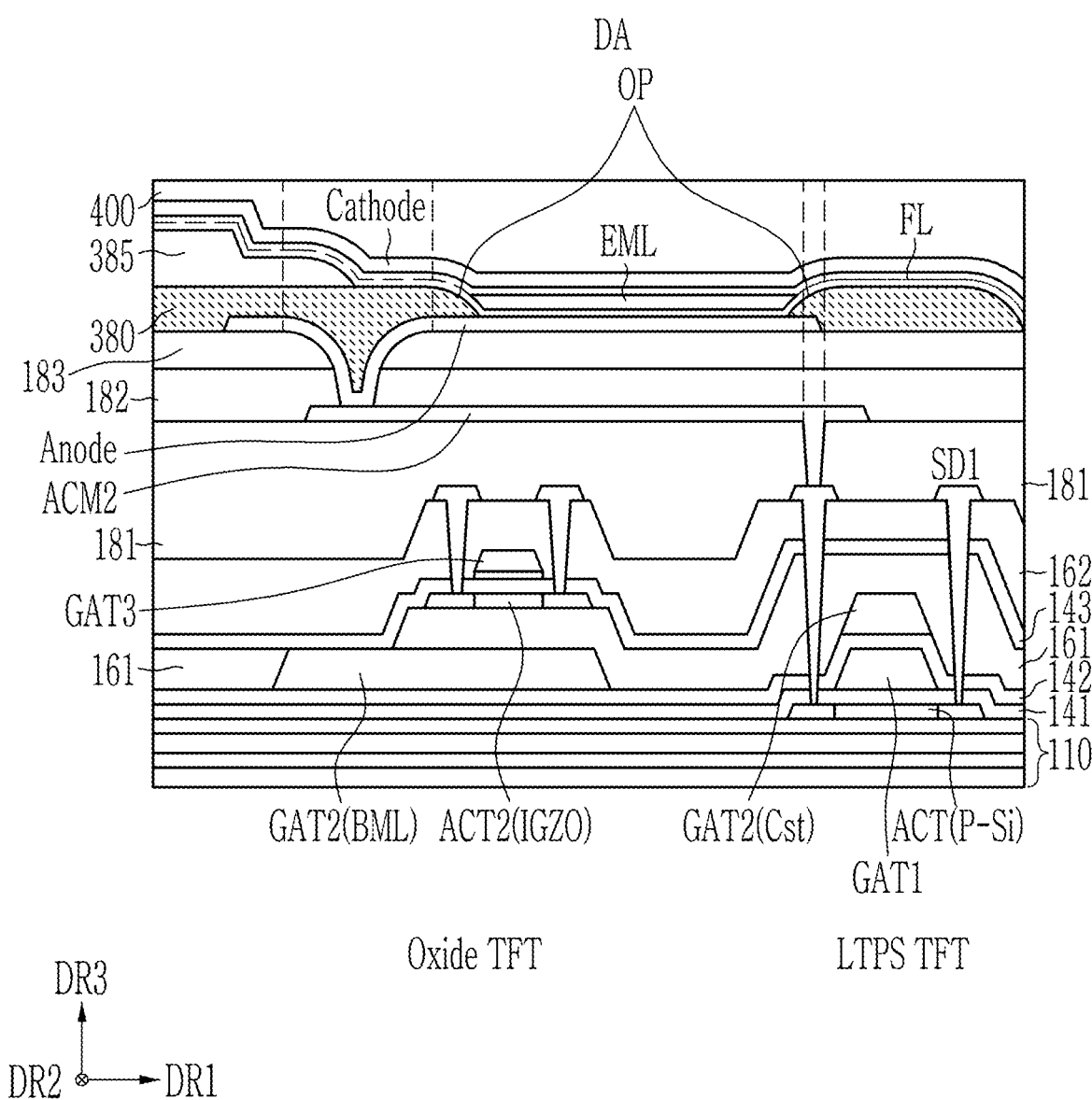
FIG. 10 illustrates a cross-sectional view of an emissive display device according to some embodiments.

The substrate 110 may include a material that has a rigid property such as glass so as to not bend, or may include a flexible material that can be bent, such as plastic or a polyimide. Referring to FIG. 10, in the case of a flexible substrate, it may be to have a structure in which a two-layer structure of a polyimide and a barrier layer formed of an inorganic insulating material thereon is doubly formed.

As illustrated in FIG. 3, a first semiconductor layer formed of a silicon semiconductor (e.g., polycrystalline semiconductor) includes a first portion and a second portion spaced apart from each other. The first portion of the first semiconductor layer includes a semiconductor of the driving transistor T1, i.e., a channel 1132, a first region 1131, and a second region 1133. In addition, the first portion of the first semiconductor layer includes not only the semiconductor of the driving transistor T1, but also a semiconductor portion 1134 for the second transistor T2, a semiconductor portion 1135 for the fifth transistor T5, and a semiconductor portion 1136 for the sixth transistor T6. Meanwhile, the second portion of the first semiconductor layer includes the semiconductor portion 1134 for the second transistor T2, and is separated from other portions. Portions of each semiconductor portion other than the channel include a region having a conductive layer characteristic by plasma treatment or doping to serve as a first electrode and a second electrode. A transistor including the first semiconductor layer may be referred to as a p-type transistor or a polycrystalline semiconductor transistor.

The channel 1132 of the driving transistor T1 may have a shape that is bent in a lowercase n-shape in a plan view. However, the shape of the channel 1132 of the driving transistor T1 is not limited thereto, and may be variously changed. For example, the channel 1132 of the driving transistor T1 may be bent in a different shape, or may be formed in a bar-like shape. The first region 1131 and the second region 1133 of the driving transistor T1 may be positioned at opposite sides of the channel 1132 of the driving transistor T1. The first region 1131 and the second region 1133 positioned in the first semiconductor layer respectively serve as the first electrode and the second electrode of the driving transistor T1.

The first semiconductor layer according to some embodiments is divided into two portions, one (first portion) of which includes the semiconductor layers of the driving transistor T1, the fifth transistor T5, and the sixth transistor T6, and the other (second portion) of which includes the semiconductor layer of the second transistor T2.

A channel, a first region, and a second region of the fifth transistor T5 are positioned in the semiconductor portion 1135 extending upward from the first region 1131 of the driving transistor T1 in the first portion of the first semiconductor layer. In addition, a channel, a first region, and a second region of the sixth transistor T6 are positioned in the portion 1136 extending upward from the second region 1133 of the driving transistor T1. Meanwhile, a portion extending downward from the first region 1131 of the driving transistor T1 may have a structure that can be connected to the second portion of the first semiconductor layer including the semiconductor layer of the second transistor T2 through a different layer.

Referring to FIG. 10, a first gate insulating layer may be located on the first semiconductor layer. The first gate insulating layer 141 may include an inorganic insulating layer including a silicon oxide (SiOx), a silicon nitride (SiNx), a silicon oxynitride (SiONx), or the like.

Figure 4:
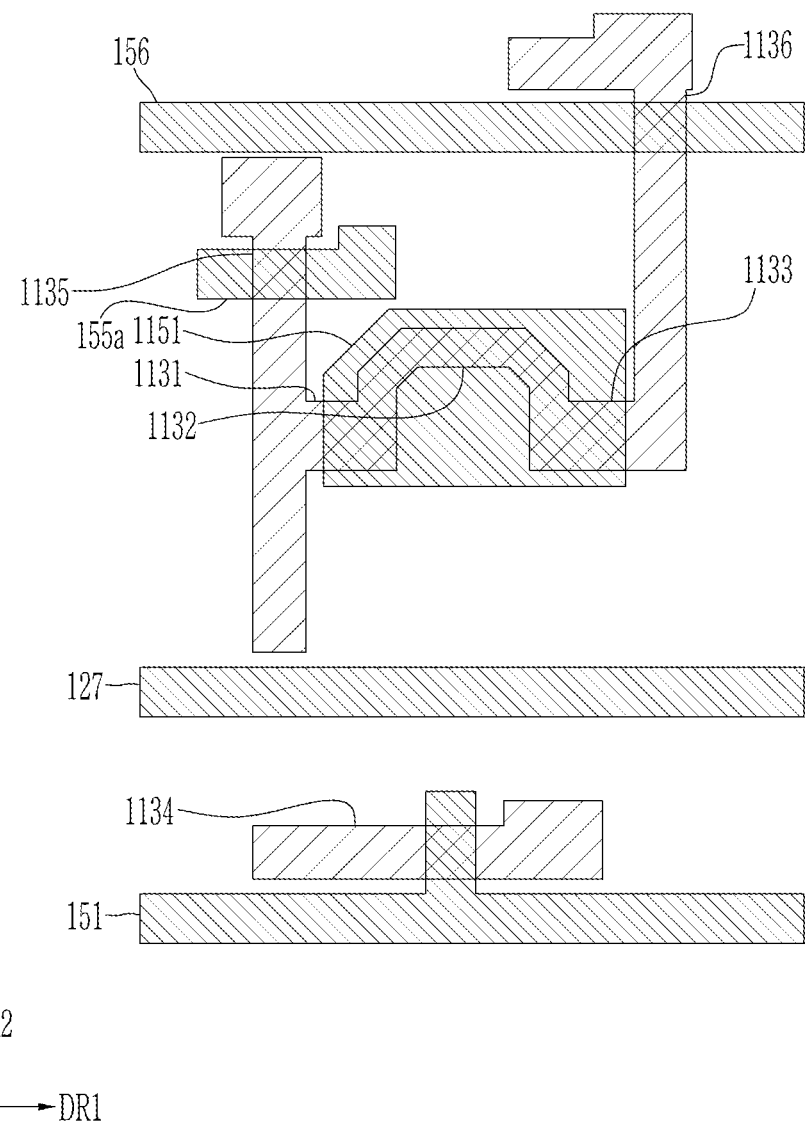

Referring to FIG. 4, a first gate conductive layer including a gate electrode 1151 of the driving transistor T1 may be positioned on the first gate insulating layer 141. The first gate conductive layer includes gate electrodes of the second transistor T2, the fifth transistor T5, and the sixth transistor T6 as well as the driving transistor T1. The gate electrode 1151 of the driving transistor T1 may overlap the channel 1132 of the driving transistor T1. The channel 1132 of the driving transistor T1 may overlap the gate electrode 1151 of the driving transistor T1.

The first gate conductive layer may further include a first scan line 151 and a second emission control line 156. The first scan line 151 and the second emission control line 156 may extend in a substantially horizontal direction (hereinafter also referred to as a first direction DR1). The first scan line 151 may include a gate electrode of the second transistor T2 protruded in a second direction DR2 that is perpendicular to the first direction DR1, and the first scan line 151 may be formed integrally with the gate electrode of the second transistor T2. Meanwhile, the second emission control line 156 may include a gate electrode of the sixth transistor T6, and the second emission control line 156 and the sixth transistor T6 may be integrally formed.

Meanwhile, the first gate conductive layer additionally includes the gate electrode 155a of the fifth transistor T5 in an island shape. The gate electrode 155a of the fifth transistor T5 may be connected to a subsequent conductive layer to receive a first scan signal.

In addition, the first gate conductive layer includes a reference voltage line 127, and the reference voltage line 127 may extend in an approximately horizontal direction (hereinafter also referred to as the first direction DR1).

The first gate conductive layer may include a metal such as copper (Cu), molybdenum (Mo), aluminum (Al), titanium (Ti), or a metal alloy thereof, and may be configured as a single layer or a multiple layer.

After the first gate conductive layer including the gate electrode 1151 of the driving transistor T1 is formed, plasma treatment or a doping process may be performed to make an exposed region of the first semiconductor layer conductive. That is, the first semiconductor layer covered by the first gate conductive layer is not conductive, and a portion of the first semiconductor layer not covered by the first gate conductive layer may have a same characteristic as that of the conductive layer. As a result, the transistor including such a conductive portion may have a p-type transistor characteristic so that the driving transistor T1, the second transistor T2, the fifth transistor T5, and the sixth transistor T6 may be p-type transistors.

Referring to FIG. 10, a second gate insulating layer 142 may be located on the first gate insulating layer 141 and the first gate conductive layer including the gate electrode 1151 of the driving transistor T1. The second gate insulating layer 142 may include an inorganic insulating layer including a silicon oxide (SiOx), a silicon nitride (SiNx), a silicon oxynitride (SiONx), or the like.

Figure 5:
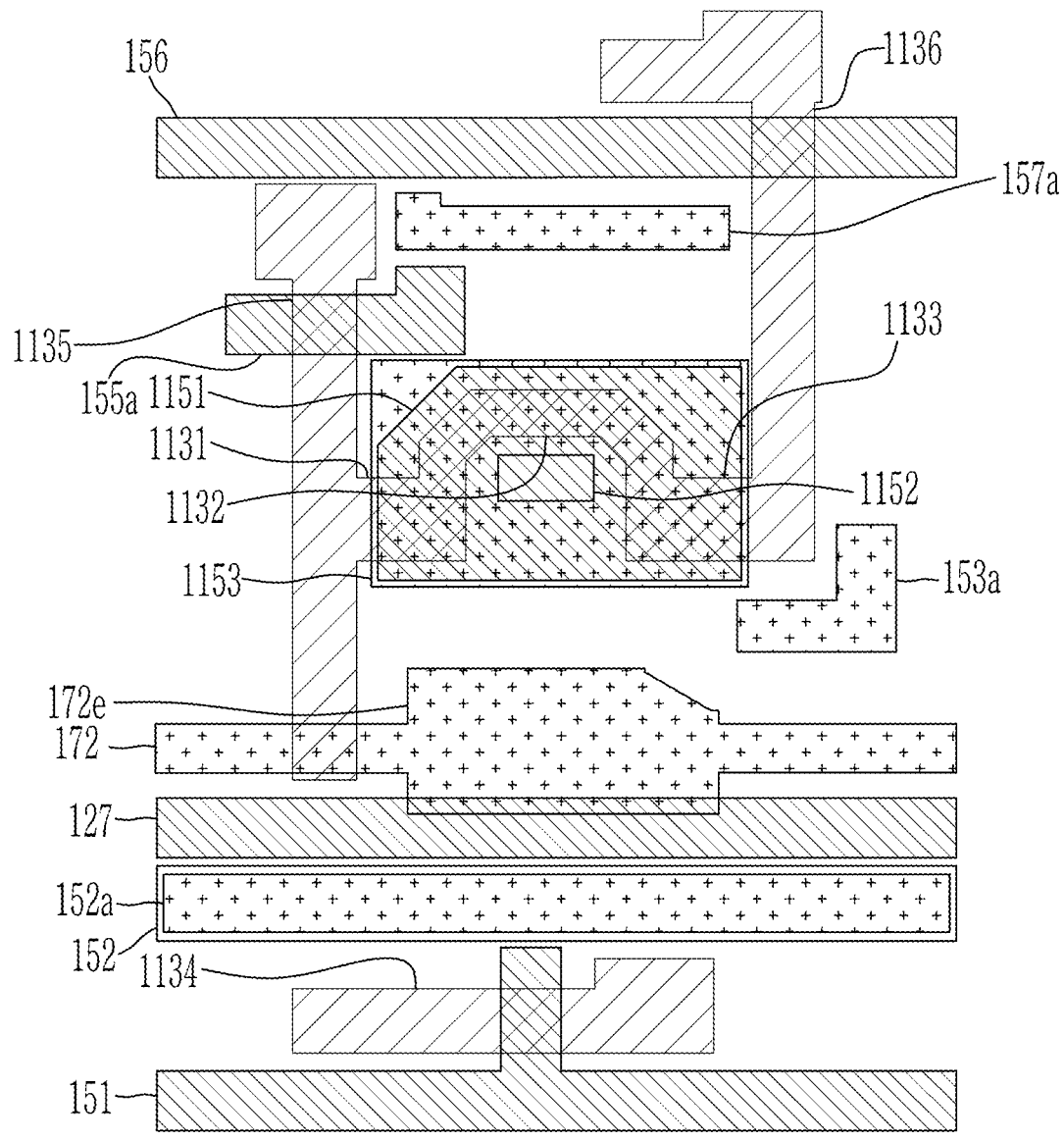
Figure 5:
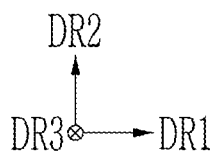

Referring to FIG. 5, a second gate conductive layer including the first storage electrode 1153 of the storage capacitor Cst may be positioned on the second gate insulating layer 142.

The first storage electrode 1153 overlaps the gate electrode 1151 of the driving transistor T1 to constitute the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. Referring to FIG. 5, the first storage electrode 1153 may have an island-like structure.

The second gate conductive layer may further include a lower second scan line 152a and a driving voltage line 172, and the lower second scan line 152a and the driving voltage line 172 may extend in a substantially horizontal direction (hereinafter also referred to as the first direction DR1). The driving voltage line 172 includes an extended portion 172e having an extended width, and the extended portion 172e corresponds to the first electrode of the hold capacitor Chold. Meanwhile, a portion of the lower second scan line 152a may include a lower shielding portion of the third transistor T3 overlapping a portion of the second semiconductor layer (refer to 3300 of FIG. 6).

The second gate conductive layer may further include a lower shielding portion 153a of the fourth transistor T4 and a lower shielding portion 157a of the seventh transistor T7, and each of the lower shielding portion 153a of the fourth transistor T4 and the lower shielding portion 157a of the seventh transistor T7 may have an island-like structure. The lower shielding portion 153a of the fourth transistor T4 overlaps a portion of the second semiconductor layer (refer to 3400 of FIG. 6), and the lower shielding portion 157a of the seventh transistor T7 overlaps a portion of the second semiconductor layer (refer to 3700 of FIG. 6).

The lower shielding portion may be positioned below channels of each of the third transistor T3, the fourth transistor T4, and the seventh transistor T7, to perform shielding from light, electromagnetic interference, or the like provided to the channels from a lower side thereof.

The second gate conductive layer GAT2 may include a metal such as copper (Cu), molybdenum (Mo), aluminum (Al), titanium (Ti), or a metal alloy thereof, and it may be configured as a single layer or a multilayer.

Referring to FIG. 10, a first interlayer insulating layer 161 may be located on the second gate conductive layer including the first storage electrode 1153 of the storage capacitor Cst. The first interlayer insulating layer 161 may include an inorganic insulating layer including a silicon oxide ($SiO_x$), a silicon nitride ($SiN_x$), a silicon oxynitride ($SiON_x$), or the like, and according to some embodiments, an inorganic insulating material may be thickly formed.

Figure 6:
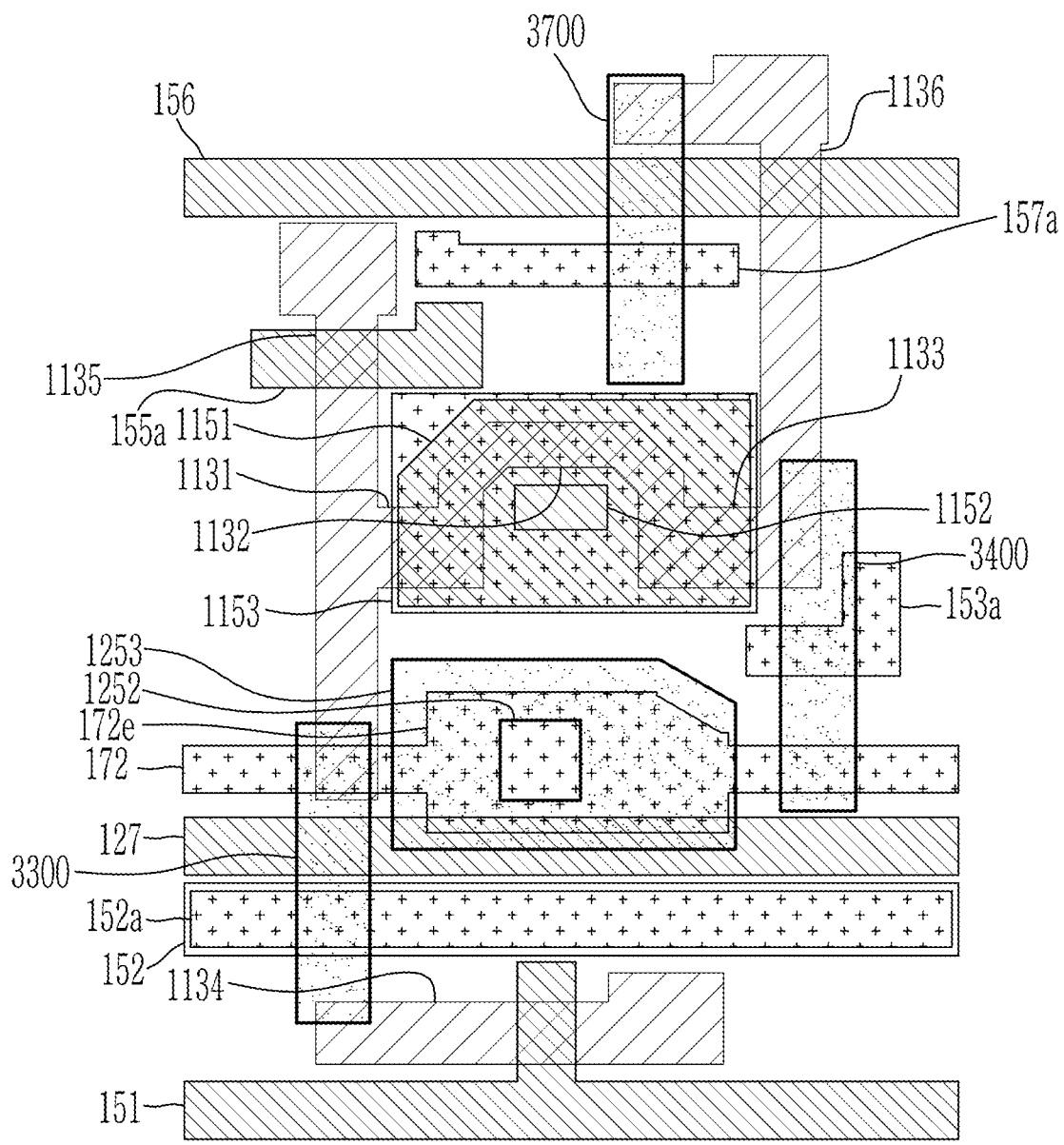

Referring to FIG. 6, an oxide semiconductor layer (hereinafter also referred to as a second semiconductor layer) including the semiconductor portion 3300 of the third transistor T3, the semiconductor portion 3400 of the fourth transistor T4, and the semiconductor portion 3700 of the seventh transistor T7 are located on the first interlayer insulating layer 161. In addition, the oxide semiconductor layer may further include a second electrode 1253 of the hold capacitor Chold.

The semiconductor portion 3300 of the third transistor T3 may include a channel, a first region, and a second region of the third transistor T3, and may have an island-like structure, and the semiconductor portion 3300 of the third transistor T3 may overlap a portion of the lower second scan line 152a positioned in the second gate conductive layer in a plan view. The semiconductor portion 3400 of the fourth transistor T4 may include a channel, a first region, and a second region of the fourth transistor T4, and may have an island-like structure, and the semiconductor portion 3400 of the fourth transistor T4 may overlap a portion of the lower shielding portion 153a of the fourth transistor T4 positioned in the second gate conductive layer in a plan view. In addition, the semiconductor portion 3700 of the seventh transistor T7 may include a channel, a first region, and a second region of the seventh transistor T7, and may have an island-like structure, and the semiconductor portion 3700 of the seventh transistor T7 may overlap a portion of the lower shielding portion 157a of the seventh transistor T7 positioned in the second gate conductive layer in a plan view.

The second electrode 1253 of the hold capacitor Chold may overlap the extension 172e of the driving voltage line 172 positioned on the second conductive layer in a plan view to constitute the hold capacitor Chold. The second electrode 1253 of the hold capacitor Chold may have an island-like structure, and may include an opening 1252, and the extension 172e of the driving voltage line 172 may be exposed by an opening 1252.

Referring to FIG. 6, the oxide semiconductor layer may be divided into four portions that are separated from each other.

Referring to FIG. 10, a third gate insulating layer 143 may be positioned on the oxide semiconductor layer.

The third gate insulating layer 143 may be positioned on entire surfaces of the oxide semiconductor layer and the first interlayer insulating layer 161. Accordingly, the third gate insulating layer 143 may cover an upper surface and a side surface of each of the semiconductor portion 3300 of the third transistor T3, the semiconductor portion 3400 of the fourth transistor T4, the semiconductor portion 3700 of the seventh transistor T7, and the second electrode 1253 of the hold capacitor Chold. However, the present embodiments are not limited thereto, and the third gate insulating layer 143 may not be positioned on entire surfaces of the oxide semiconductor layer and the first interlayer insulating layer 161.

The third gate insulating layer 143 may include an inorganic insulating layer including a silicon oxide ($SiO_x$), a silicon nitride ($SiN_x$), a silicon oxynitride ($SiON_x$), or the like.

Figure 7:
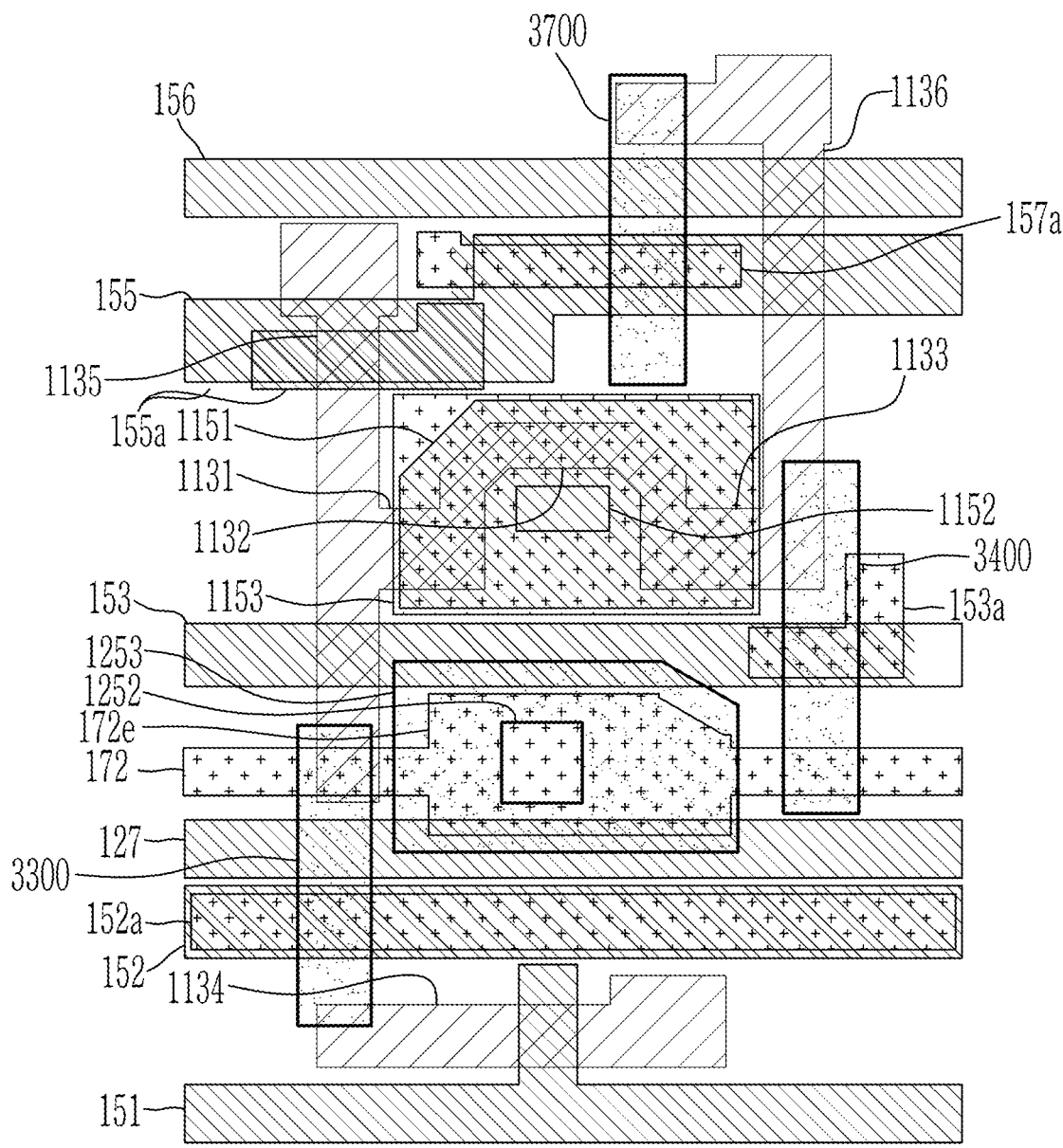

Referring to FIG. 7, a third gate conductive layer including the second scan line 152, the third scan line 153, and the first emission control line 155 may be formed.

The second scan line 152 extends in approximately a first direction, and includes the gate electrode of the third transistor T3. In addition, the second scan line 152 overlaps the lower second scan line 152a positioned in the second gate conductive layer in a plan view, and may be electrically connected thereto by a subsequent conductive layer.

The third scan line 153 extends approximately in the first direction and includes the gate electrode of the fourth transistor T4. In addition, the third scan line 153 overlaps the lower shielding portion 153a of the fourth transistor T4 positioned in the second gate conductive layer in a plan view, and may be electrically connected thereto by a subsequent conductive layer.

The first emission control line 155 extends approximately in the first direction and includes the gate electrode of the seventh transistor T7. In addition, the first emission control line 155 overlaps the gate electrode 155a of the fifth transistor T5 positioned on the first gate conductive layer and the lower shielding portion 157a of the seventh transistor T7 positioned on the second gate conductive layer in a plan view, and may be electrically connected thereto by a subsequent conductive layer.

The third gate conductive layer GAT3 may include a metal such as copper (Cu), molybdenum (Mo), aluminum (Al), titanium (Ti), or a metal alloy thereof, and it may be configured as a single layer or a multilayer.

After forming the third gate conductive layer, through plasma treatment or a doping process, a portion of the oxide semiconductor layer covered by the third gate conductive layer is formed as a channel, and a portion of the oxide semiconductor layer not covered by the third gate conductive layer becomes conductive. The channel of the third transistor T3 overlaps the second scan line 152 in a plan view, the channel of the fourth transistor T4 overlaps the third scan line 153 in a plan view, and the channel of the seventh transistor T7 overlaps the first emission control line 155 in a plan view. Meanwhile, the second electrode 1253 of the hold capacitor Chold, which is an oxide semiconductor layer that is not covered with the third gate conductive layer, may be made into a conductor through plasma treatment or a doping process to function as an electrode. A transistor including an oxide semiconductor layer may have characteristics of an n-type transistor.

Referring to FIG. 10, a second interlayer insulating layer 162 may be positioned on the third gate conductive layer. The second interlayer insulating layer 162 may have a single- or multi-layered structure. The second interlayer insulating layer 162 may include an inorganic insulating material such as a silicon nitride ($SiN_x$), a silicon oxide ($SiO_x$), and a silicon oxynitride ($SiO_xN_y$), and may include an organic material according to some embodiments.

Figure 8:
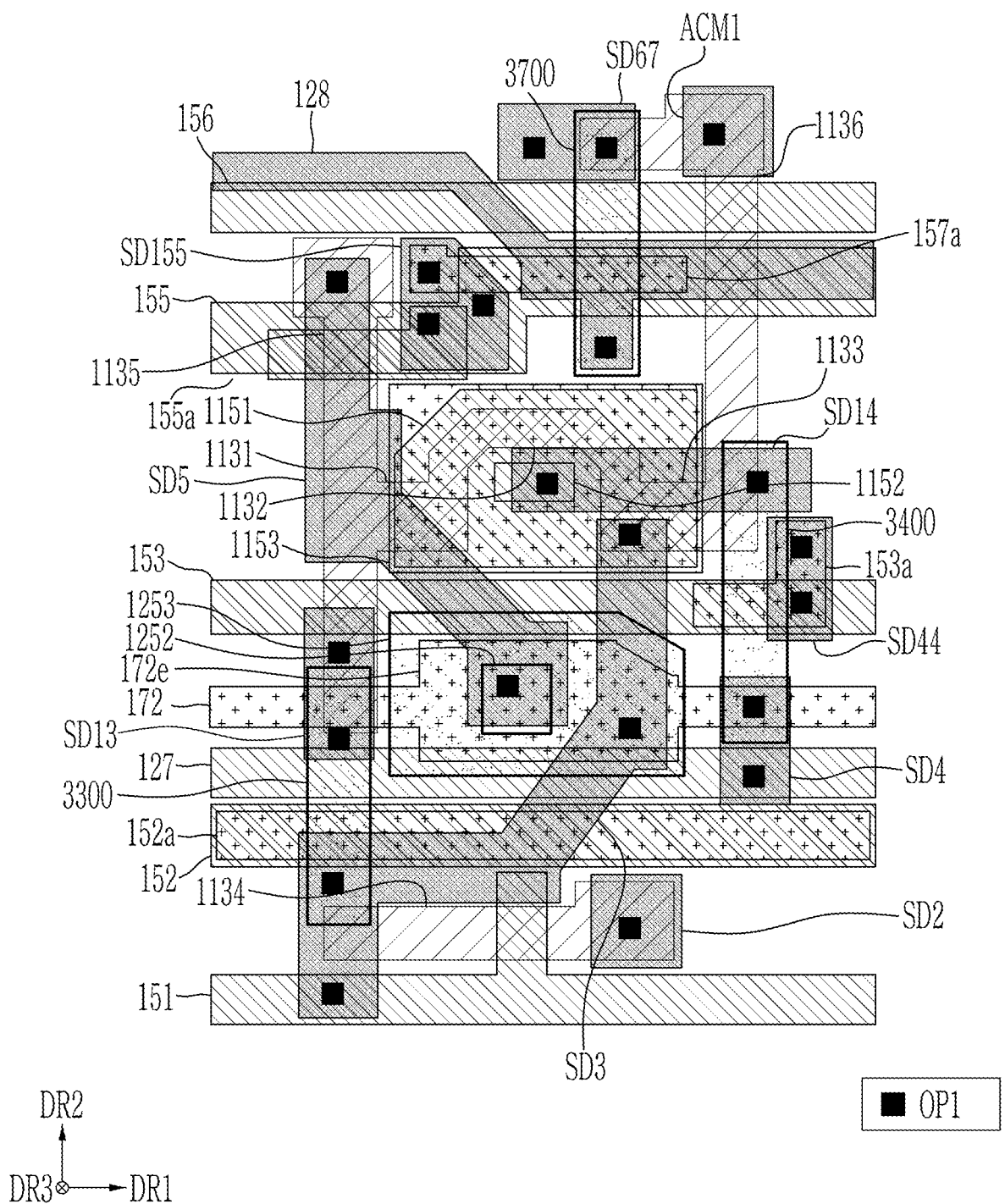

Referring to FIG. 8, an opening OP1 may be formed in the second interlayer insulating layer 162.

The opening OP1, which is an opening formed in at least one of the second interlayer insulating layer 162, the third gate insulating layer 143, the first interlayer insulating layer 161, the second gate insulating layer 142, and the first gate insulating layer 141, may expose one of the first semiconductor layer, the first gate conductive layer, the second gate conductive layer, the oxide semiconductor layer, and the third gate conductive layer.

When the opening OP1 is formed, the gate electrode 1151 of the driving transistor T1 may be exposed by also forming the opening OP1 overlapping the opening 1152 of the first storage electrode 1153 of the storage capacitor Cst. In addition, when the opening OP1 is formed, the extension 172e of the driving voltage line 172 may be exposed by also forming an opening OP1 overlapping the opening 1252 of the second electrode 1253 of the hold capacitor Chold.

Referring again to FIG. 8, a first data conductive layer may be formed.

The first data conductive layer may include an initialization voltage line 128 and a plurality of connecting members.

The initialization voltage line 128 extends in approximately the first direction, has a protrusion, and is connected to a first end of the semiconductor portion 3700 of the seventh transistor T7 through the protrusion and the opening OP1. As a result, the initialization voltage Vaint is transferred to the seventh transistor T7.

Each connection member positioned on the first data conductive layer will be described as follows.

A connection member SD14 is a portion that connects the gate electrode 1151 of the driving transistor T1 to one end (the second electrode) of the semiconductor portion 3400 of the fourth transistor T4. The connecting member SD14 may be connected to the gate electrode 1151 of the driving transistor T1 exposed through the opening OP1 positioned in the opening 1152 of the first storage electrode 1153 of the storage capacitor Cst in order to be connected to the gate electrode 1151 of the driving transistor T1.

A connecting member SD2 is a connecting member that is connected to one end of the semiconductor portion 1134 for the second transistor T2 to assist in connection with a subsequent conductive layer (second data conductive layer)

The data line 171 and the first electrode of the second transistor T2 may be connected by the connecting member SD2.

A connecting member SD3 is a portion that is connected to each of the first storage electrode 1153 of the storage capacitor Cst, the second electrode 1253 of the hold capacitor Chold, one end (first electrode) of the semiconductor portion 3300 of the third transistor T3, and one end (second electrode) of the semiconductor portion 1134 for the second transistor T2 through the opening OP1. A portion connected to the connecting member SD3 constitutes a first node, and thus is also referred to as a first node connecting member.

The connecting member SD4 is a portion that connects one end (the first electrode) of the semiconductor portion 3400 of the fourth transistor T4 and the reference voltage line 127 positioned in the first gate conductive layer.

The connecting member SD44 is a portion that connects the lower shielding portion 153a of the fourth transistor T4 and the third scan line 153.

A connecting member SD5, which is a portion that connects the extension 172e of the driving voltage line 172 and one end (first electrode) of the semiconductor portion 1135 for the fifth transistor T5, transfers the driving voltage ELVDD to one end (first electrode) of the semiconductor portion 1135 for the fifth transistor T5. The connecting member SD5 may be connected to the extension 172e of the driving voltage line 172 exposed through the opening OP1 positioned in the opening 1252 of the second electrode 1253 of the hold capacitor Chold. Since the connecting member SD5 is a connecting member to which the driving voltage ELVDD is transferred, it is also referred to as a driving voltage connecting member.

The connecting member SD13 is a portion that connects one end (second electrode) of the semiconductor portion 3300 of the third transistor T3 and the first region 1131 of the driving transistor T1 positioned in the first semiconductor layer. Since the connecting member SD13 connects the first semiconductor layer and the second semiconductor layer, it is also referred to as a semiconductor layer connecting member hereinafter.

The connecting member SD155 is a portion that connects the first emission control line 155 positioned in the third gate conductive layer, the lower shielding portion 157a of the seventh transistor T7 positioned in the second gate conductive layer, and the gate electrode 155a of the fifth transistor T5 positioned in the first gate conductive layer.

The connecting member SD67 is a portion that connects one end (second electrode) of the semiconductor portion 3700 of the seventh transistor T7 and one end (second electrode) of the semiconductor portion 1136 for the sixth transistor T6. Meanwhile, a light emitting diode connecting member ACM1 is a connecting member positioned at one end (second electrode) of the semiconductor portion 1136 for the sixth transistor T6 to assist in connection with a subsequent conductive layer (second data conductive layer). The light emitting diode connecting member ACM1 may be connected to a second light emitting diode connecting member ACM2 to be described later, to be connected to one electrode of the light emitting diode.

A first data conductive layer SD1 may include a metal such as aluminum (Al), copper (Cu), molybdenum (Mo), titanium (Ti), or a metal alloy thereof, and may be configured as a single layer or a multiple layer.

Referring to FIG. 10, a first organic layer 181 may be positioned on the first data conductive layer. The first organic layer 181 may be an organic insulating layer including an organic material, and may include at least one material of a polyimide, a polyamide, an acrylic resin, benzocyclobutene, and a phenol resin as an organic material.

Figure 9:
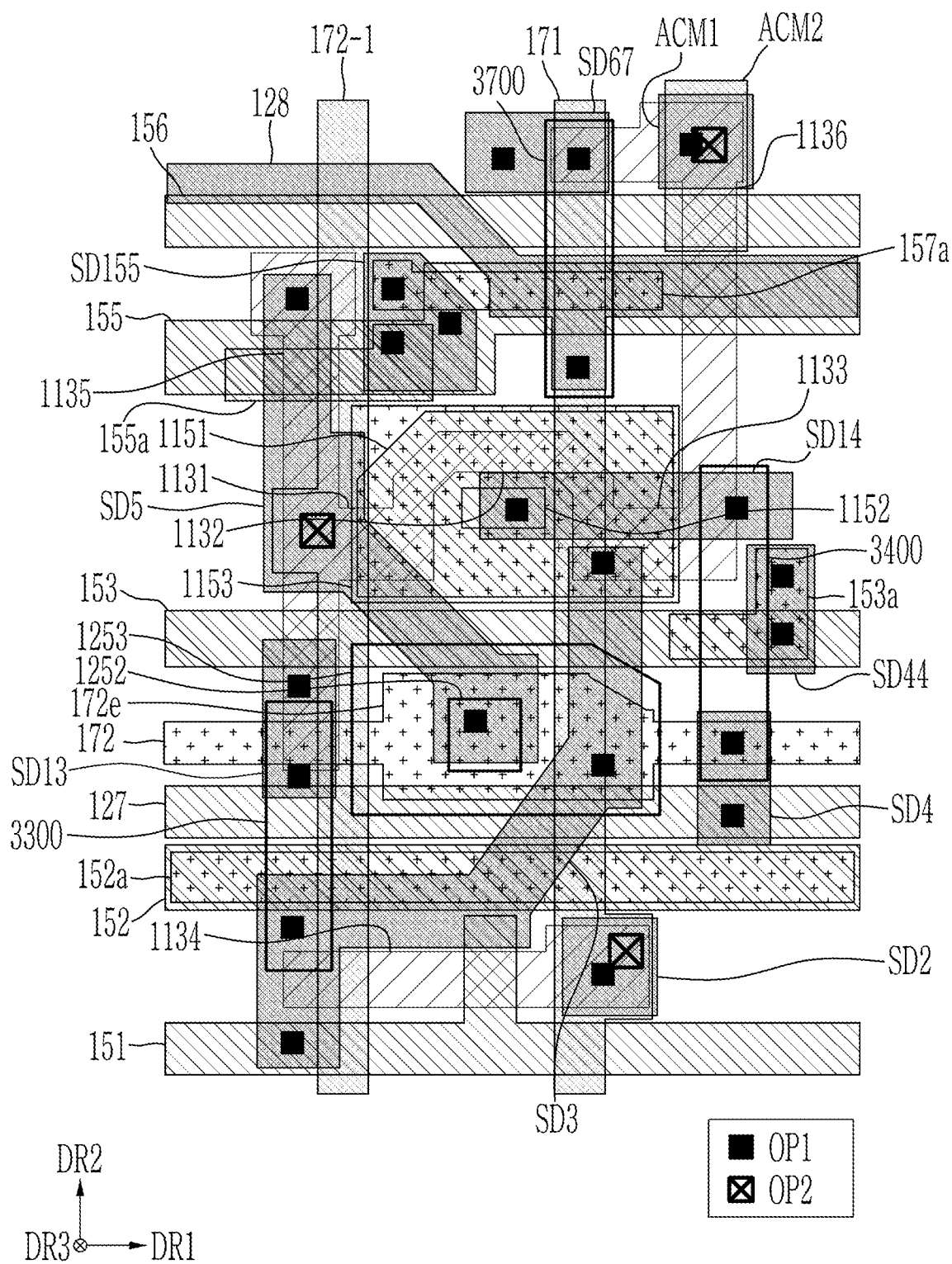

Referring to FIG. 9, an opening OP2 is positioned in the first organic layer 181. A second data conductive layer including the data line 171, a driving voltage line 172-1 (hereinafter also referred to as a vertical driving voltage line), and the second light emitting diode connecting member ACM2 is positioned on the first organic layer 181.

The data line 171 and the driving voltage line 172-1 may extend in a substantially vertical direction (second direction DR2).

The data line 171 is connected to the connecting member SD2 of the first data conductive layer through the opening OP2, and accordingly, it is connected to the first electrode of the second transistor T2.

The driving voltage line 172-1 is connected to the connecting member SD5 of the first data conductive layer through the opening OP2, and accordingly, it is connected to the first electrode of the fifth transistor T5 and the extension 172e of the driving voltage line 172. All of them are applied with a driving voltage ELVDD, wires to which the driving voltage ELVDD is applied include the driving voltage line 172-1 (hereinafter also referred to as a vertical driving voltage line) positioned in the second data conductive layer in the second direction DR2, and the driving voltage line 172 (hereinafter also referred to as a horizontal driving voltage line) positioned in the second gate conductive layer in the first direction DR1.

The second light emitting diode connecting member ACM2 is electrically connected to the light emitting diode connecting member ACM1 of the first data conductive layer through the opening OP2, and is electrically connected to the second electrode of the sixth transistor T6.

Referring to FIG. 10, a second organic layer 182 and a third organic layer 183 are located on the second data conductive layer, and openings exposing the second light emitting diode connecting member ACM2 are formed in the second organic layer 182 and the third organic layer 183. One electrode of the light emitting diode and the second light emitting diode connecting member ACM2 are electrically connected to each other through the openings positioned in the second organic layer 182 and the third organic layer 183.

The second organic layer 182 and the third organic layer 183 may each be an organic insulator, and may include at least one material of a polyimide, a polyamide, an acryl resin, benzocyclobutene, and a phenol resin. According to some embodiments, the third organic layer 183 may be omitted.

Hereinafter, a detailed cross-sectional structure will be described with reference to FIG. 10, and a structure of a light emitting diode (LED) on a pixel circuit unit will be described below.

FIG. 10 illustrates a cross-sectional view of an emissive display device according to some embodiments.

Up to the second data conductive layer in the detailed stacked structure of the pixel illustrated in FIG. 10 has been described in more detail with reference to FIG. 3 to FIG. 9. In the embodiments illustrated with respect to FIG. 10, the pixel circuit unit may include the second organic layer 182 and the third organic layer 183, indicating a configuration therebelow, and a light emitting diode may be an upper portion of the third organic layer 183, indicating a configuration positioned under the encapsulation layer 400.

Referring to FIG. 10, a stacked structure on an anode in a pixel of the display area DA is as follows.

The anode is positioned on the third organic layer 183, and is connected to the second light emitting diode connecting member ACM2 through the openings positioned in the second organic layer 182 and the third organic layer 183.

A pixel defining layer 380 having an opening OP exposing the anode and covering at least a portion of the anode may be positioned on the anode. The pixel defining layer 380 may have a black color, or may be formed by using a transparent organic material.

A spacer 385 may be positioned at a portion where the pixel defining layer 380 is positioned, and when the pixel defining layer 380 is formed, the spacer 385 may also be formed. As a result, the pixel defining layer 380 and the spacer 385 may be formed by using a same material. However, according to some embodiments, the spacer 385 and the pixel defining layer 380 may be formed by using different materials.

A functional layer FL and a cathode may be sequentially formed on the anode, the spacer 385, and the pixel defining layer 380, and the functional layer FL and the cathode may be formed over the entire region. An emission layer EML may be located between functional layers FL and in the opening OP of the pixel defining layer 380. Hereinafter, the functional layer FL and the emission layer EML may be referred to as an intermediate layer. The functional layer FL may include at least one of auxiliary layers such as an electron injection layer, an electron transport layer, a hole transport layer, and a hole injection layer, the hole injection layer and the hole transport layer may be located under the emission layer EML, and the electron transport layer and the electron injection layer may be located on the emission layer EML.

An encapsulation layer 400 is located on the cathode. The encapsulation layer 400 includes at least one inorganic layer and at least one organic layer, and may have a triple-layer structure including a first inorganic encapsulation layer, an organic encapsulation layer, and a second inorganic encapsulation layer according to some embodiments. The encapsulation layer 400 may be for protecting the emission layer EML from moisture or oxygen that may be introduced from the outside. According to some embodiments, the encapsulation layer 400 may include a structure in which an inorganic layer and an organic layer are further sequentially stacked.

A configuration enabling touch sensing on the encapsulation layer 400 may be further included according to some embodiments, and a configuration such as a light blocking member or a color filter may be further included according to some embodiments. According to some embodiments, a color conversion layer including quantum dots or a reflection control layer may be included instead of a color filter.

In the above, the emissive display device and the overall structure of the pixel has been described in more detail.

Hereinafter, various modifications of the embodiments of FIG. 1 and FIG. 2 will be described with reference to FIG. 11 to FIG. 26.

First, a deformed waveform will be described with reference to FIG. 11.

Figure 11:
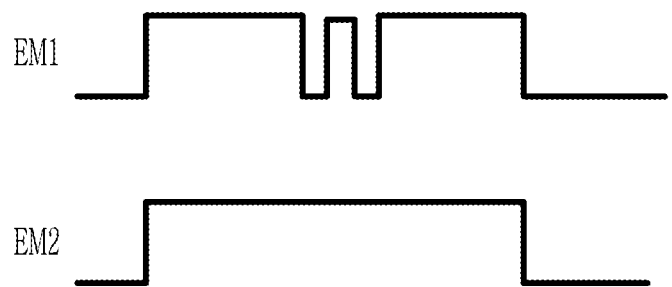
FIG. 11 illustrates a waveform diagram showing a signal applied to the pixel of FIG. 1 according to some embodiments.

FIG. 11 illustrates a waveform diagram showing a signal applied to the pixel of FIG. 1.

FIG. 11 illustrates that a high voltage and a low voltage may be repeatedly applied within a short time during a period other than an emission period of the first emission control signal EM1. Such a repeated application period of the first emission control signal EM1 may be located in one of an initialization period, a compensation period, and a writing period, and may be positioned over two adjacent periods.

FIG. 11 illustrates embodiments in which timings at which the first emission control signal EM1 and the second emission control signal EM2 are changed are the same, unlike in FIG. 1, but it is not limited to such embodiments, and as illustrated in FIG. 1, even in embodiments in which the first light emission control signal EM1 is changed to a high voltage later, a low voltage and a high voltage may be alternately applied for a while during a period in which the first light emission control signal EM1 is a high voltage. The deformation of the waveform of FIG. 11 may be applied to all of the embodiments to be described later.

Hereinafter, a modification of FIG. 1 and FIG. 2 will be described with reference to FIG. 12 and FIG. 13.

Figure 12:
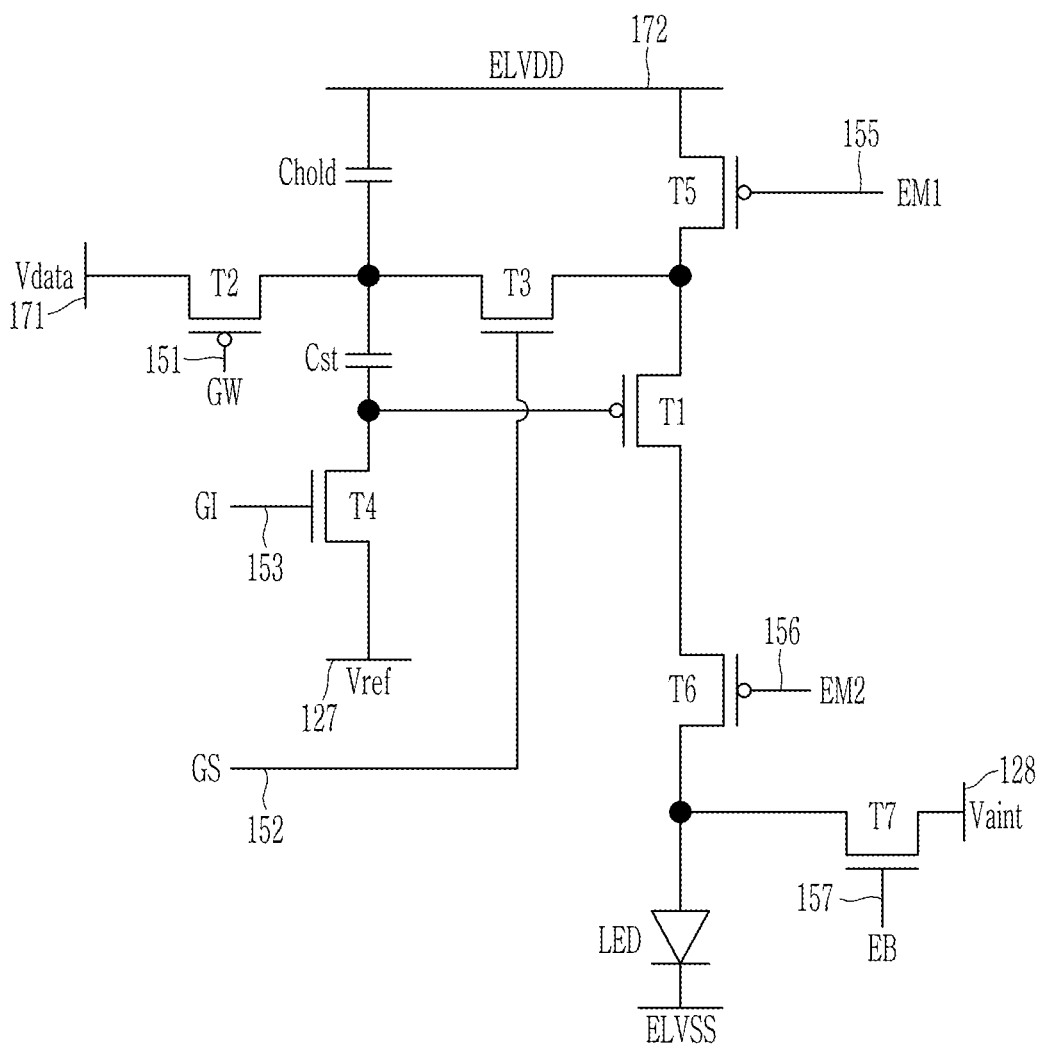
FIG. 12 illustrates an equivalent circuit diagram of a pixel included in an emissive display device according to some embodiments.
Figure 13:
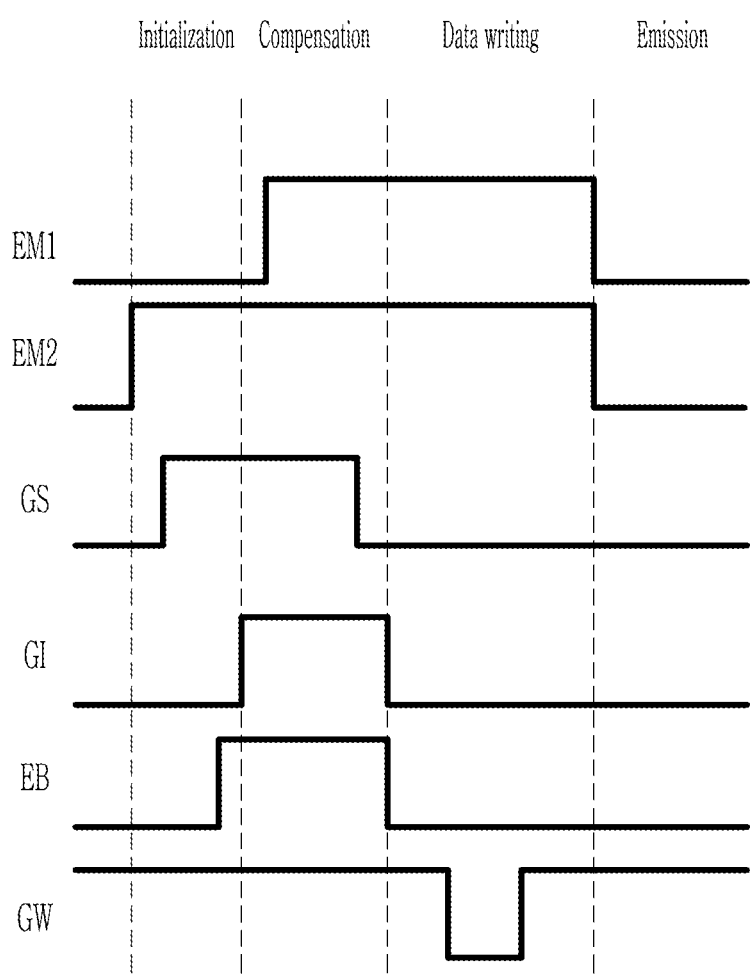
FIG. 13 illustrates a waveform diagram showing a signal applied to the pixel of FIG. 12 according to some embodiments.

FIG. 12 illustrates an equivalent circuit diagram of a pixel included in an emissive display device according to some embodiments, and FIG. 13 illustrates a waveform diagram showing a signal applied to the pixel of FIG. 12.

In FIG. 12, unlike the pixel of FIG. 1, the gate electrode of the seventh transistor T7 and the gate electrode of the fifth transistor T5 receive different signals. That is, the gate electrode of the seventh transistor T7 is connected to the fourth scan line 157, and receives a fourth scan signal EB.

Referring to FIG. 13, embodiments in which the fourth scan signal EB applied to the fourth scan line 157 may be changed from a low voltage to a high voltage at a same timing as that of the first emission control signal EM1, but the timing of changing the high voltage to the low voltage may be different is illustrated. Particularly, referring to FIG.

13, a high voltage is applied to the fourth scan signal EB only during the compensation period so that the seventh transistor T7 is turned on only during the compensation period, to transmit the initialization voltage Vaint to one electrode of the light emitting diode LED.

Hereinafter, another modification of FIG. 1 and FIG. 2 will be described with reference to FIG. 14 and FIG. 15.

Figure 14:
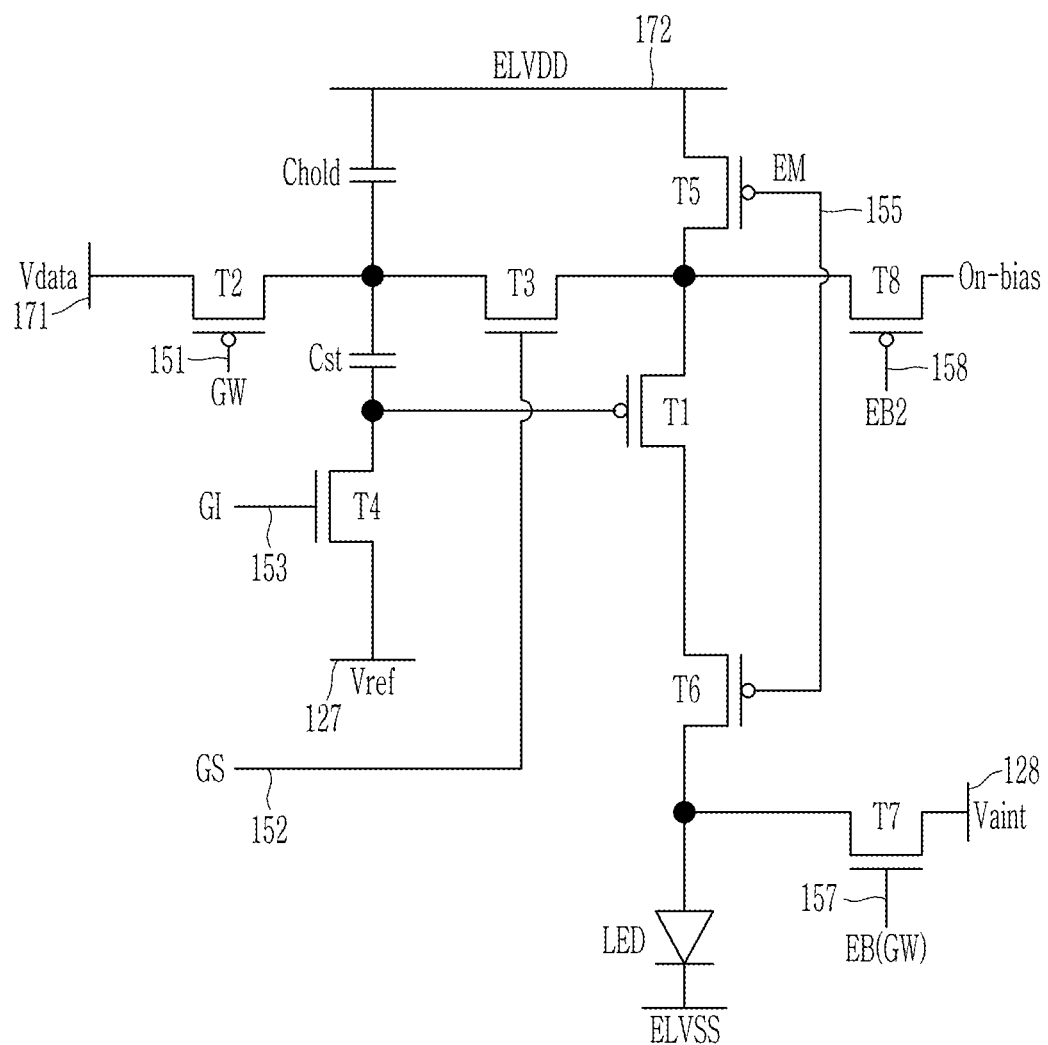
FIG. 14 illustrates an equivalent circuit diagram of a pixel included in an emissive display device according to some embodiments.
Figure 15:
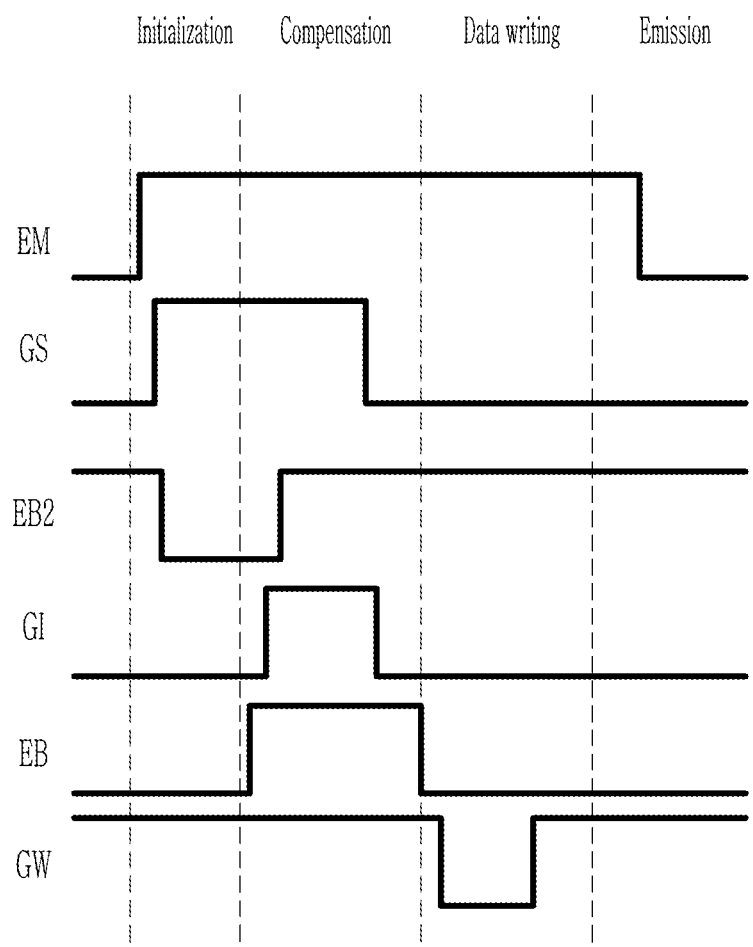
FIG. 15 illustrates a waveform diagram showing a signal applied to the pixel of FIG. 14 according to some embodiments.

FIG. 14 illustrates an equivalent circuit diagram of a pixel included in an emissive display device according to some embodiments, and FIG. 15 illustrates a waveform diagram showing a signal applied to the pixel of FIG. 14.

The pixel structure of FIG. 14 further includes an eighth transistor T8 in the pixel structure of FIG. 1, and as illustrated in FIG. 12, the gate electrode of the seventh transistor T7 and the gate electrode of the fifth transistor T5 receive different signals, and the gate electrode of the fifth transistor T5 and the gate electrode of the sixth transistor T6 receive the same emission control signal EM.

In FIG. 14, the eighth transistor T8, which is a p-type transistor, includes a polycrystalline semiconductor as a semiconductor layer. The eighth transistor T8 serves to transfer a bias voltage On-bias to the first electrode of the driving transistor T1. Hereinafter, the eighth transistor T8 is also referred to as a bias transistor. A gate electrode of the eighth transistor T8 is connected to the fifth scan line 158 to receive the fifth scan signal EB2, a first electrode of the eighth transistor T8 receives the bias voltage On-bias, and the second electrode of the eighth transistor T8 is connected to the first electrode of the driving transistor T1, the second electrode of the third transistor T3, and the second electrode of the fifth transistor T5.

The eighth transistor T8 may be turned on to change the bias voltage On-bias to the first electrode of the driving transistor T1 so that the voltage of the first electrode of the driving transistor T1 may be maintained at the bias voltage On-bias, thereby preventing or reducing a voltage relationship of each terminal of the driving transistor T1 from being changed and allowing the driving transistor T1 to generate a constant output current. In particular, when low frequency driving is performed, the driving transistor T1 must generate an output current for a long time by using one data voltage Vdata that is inputted through the second transistor T2, but as time goes by, while as the voltage relationship of each terminal of the driving transistor T1 is changed, an output current may be changed. However, the bias voltage On-bias is periodically applied to prevent or reduce changes in the voltage relationship of the driving transistor T1 and to keep the output current constant.

The bias voltage On-bias may have a constant voltage level, it may be a voltage at a level corresponding to the driving voltage ELVDD, and a different voltage may be set for each device depending on characteristics of the emissive display device.

Referring to FIG. 15, the emission period ends as the emission signal EM is changed to a high voltage, and the initialization period is entered. In this case, the fifth transistor T5 and the sixth transistor T6 are simultaneously turned off.

During the initialization period, the fifth scan signal EB2 is changed to a low voltage to turn on the eighth transistor T8, and the second scan signal GS is changed to a high voltage to turn on the third transistor T3. As a result, the driving voltage ELVDD is transferred to the first node through the third transistor T3.

Thereafter, during the compensation period, the fifth scan signal EB2 is changed to a high voltage so that the eighth transistor T8 is turned off, and the third scan signal GI is changed to a high voltage so that the fourth transistor T4 is turned on to change portions (the second electrode of the storage capacitor Cst and the gate electrode of the driving transistor T1) connected to the second electrode of the fourth transistor T4 to the reference voltage Vref.

During the compensation period, the voltage of the first electrode of the storage capacitor Cst and the voltage of the first electrode of the driving transistor T1 may be higher than the reference voltage Vref by the threshold voltage Vth.

In addition, during the compensation period, the fourth scan signal EB has a high voltage so that the seventh transistor T7 is turned on, and one electrode of the light emitting diode LED is changed to the initialization voltage Vaint.

Thereafter, during the writing period, the data voltage Vdata is transferred into the pixel, and then, during the emission period, the emission control signal EM is changed to a low voltage to turn on the fifth transistor T5 and the sixth transistor T6 so that the output current of the driving transistor T1 is transmitted to the light emitting diode LED and light is emitted. Operations of the writing period and the emission period may be the same as described in FIG. 1 and FIG. 2.

Hereinafter, another modification of FIG. 14 and FIG. 15 will be described with reference to FIG. 16 and FIG. 17.

Figure 16:
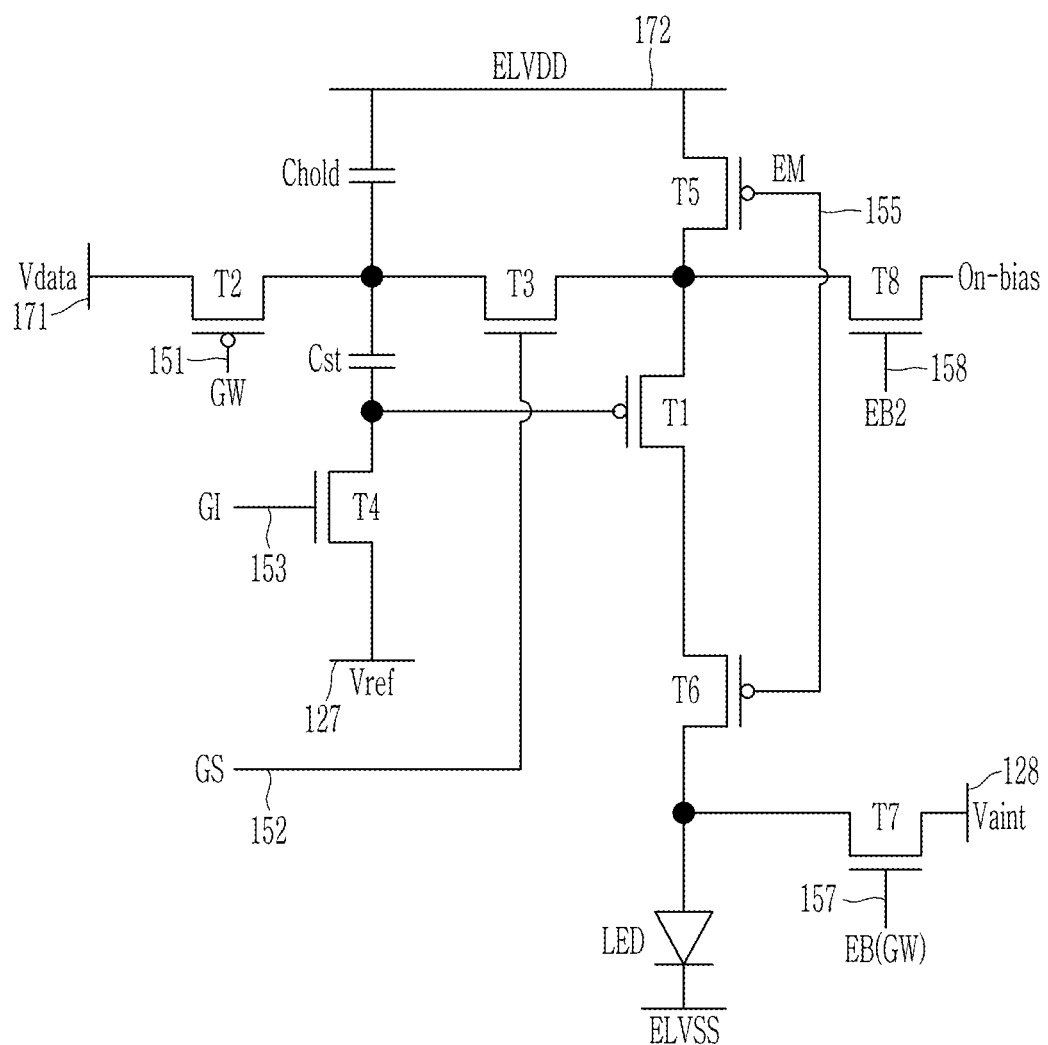
FIG. 16 illustrates an equivalent circuit diagram of a pixel included in an emissive display device according to some embodiments.
Figure 17:
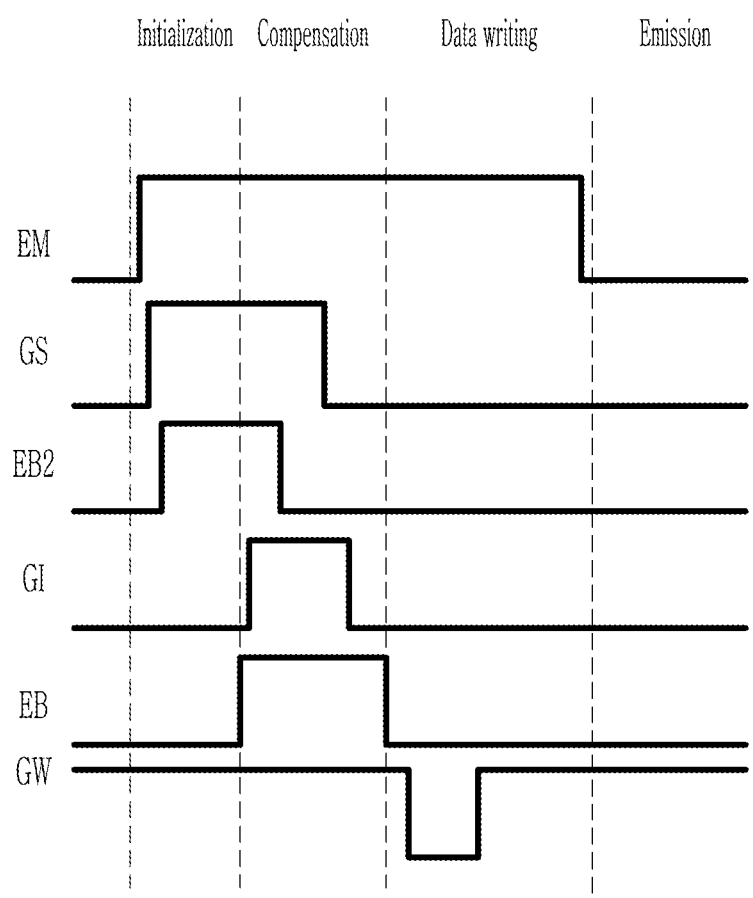
FIG. 17 illustrates a waveform diagram showing a signal applied to the pixel of FIG. 16 according to some embodiments.

FIG. 16 illustrates an equivalent circuit diagram of a pixel included in an emissive display device according to some embodiments, and FIG. 17 illustrates a waveform diagram showing a signal applied to the pixel of FIG. 16.

In FIG. 16, unlike the embodiments illustrated with respect to FIG. 14, it is a pixel in which the eighth transistor T8 is changed to an n-type transistor. As a result, a high voltage is required to turn on the eighth transistor T8, and thus, referring to FIG. 17, unlike FIG. 15, the fifth scan signal EB2 is changed to a low voltage during the initialization period, and has a high voltage during the remaining period.

According to the embodiments illustrated with respect to FIG. 16 and FIG. 17, it may operate in the same manner as in FIG. 14 and FIG. 15.

According to some embodiments, the seventh transistor T7 may be changed to a p-type transistor, and in that case, the fourth scan signal EB may be changed to a low voltage during the compensation period.

Hereinafter, another modification of FIG. 14 and FIG. 15 will be described with reference to FIG. 18 and FIG. 19.

Figure 18:
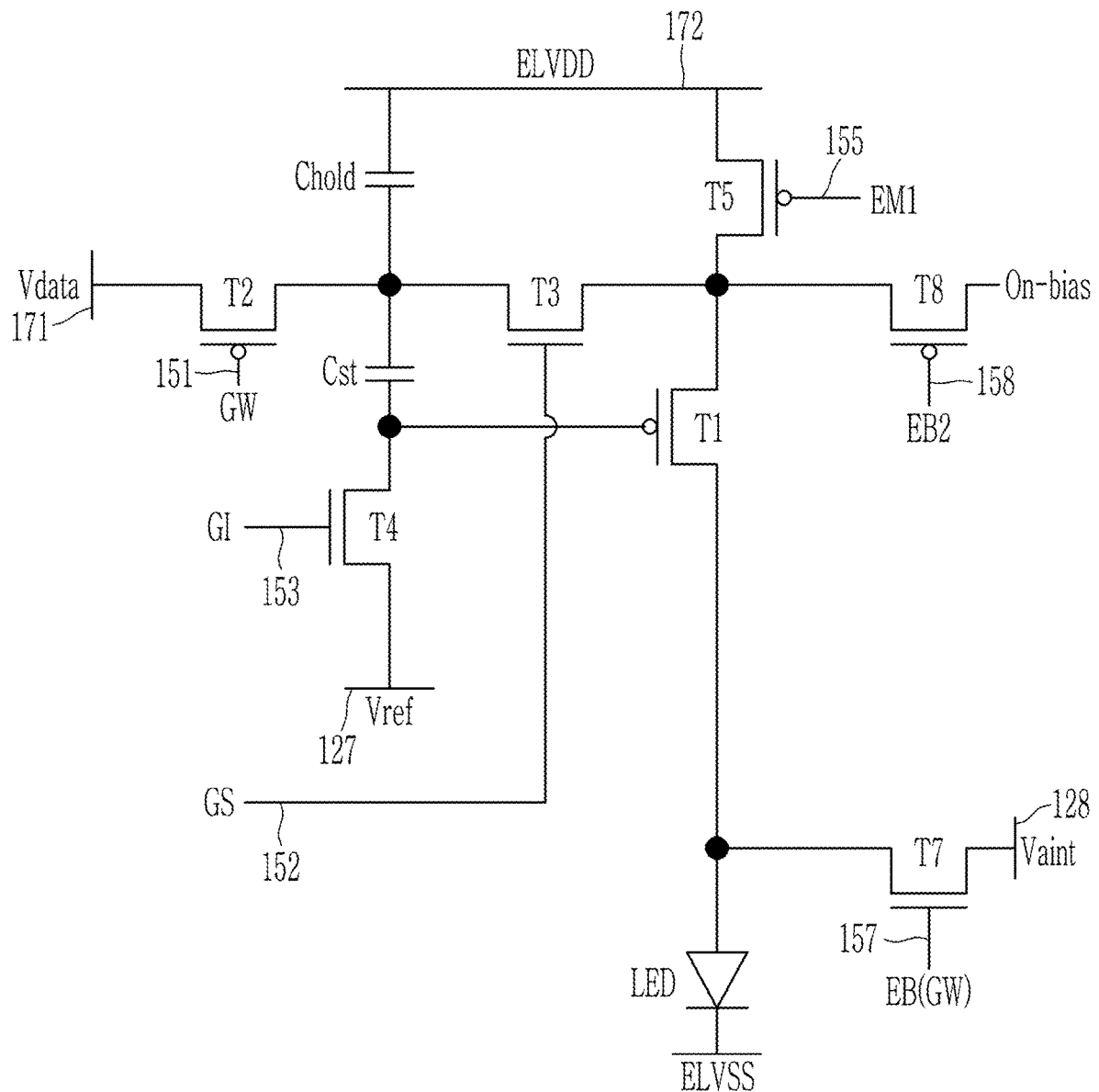
FIG. 18 illustrates an equivalent circuit diagram of a pixel included in an emissive display device according to some embodiments.
Figure 19:
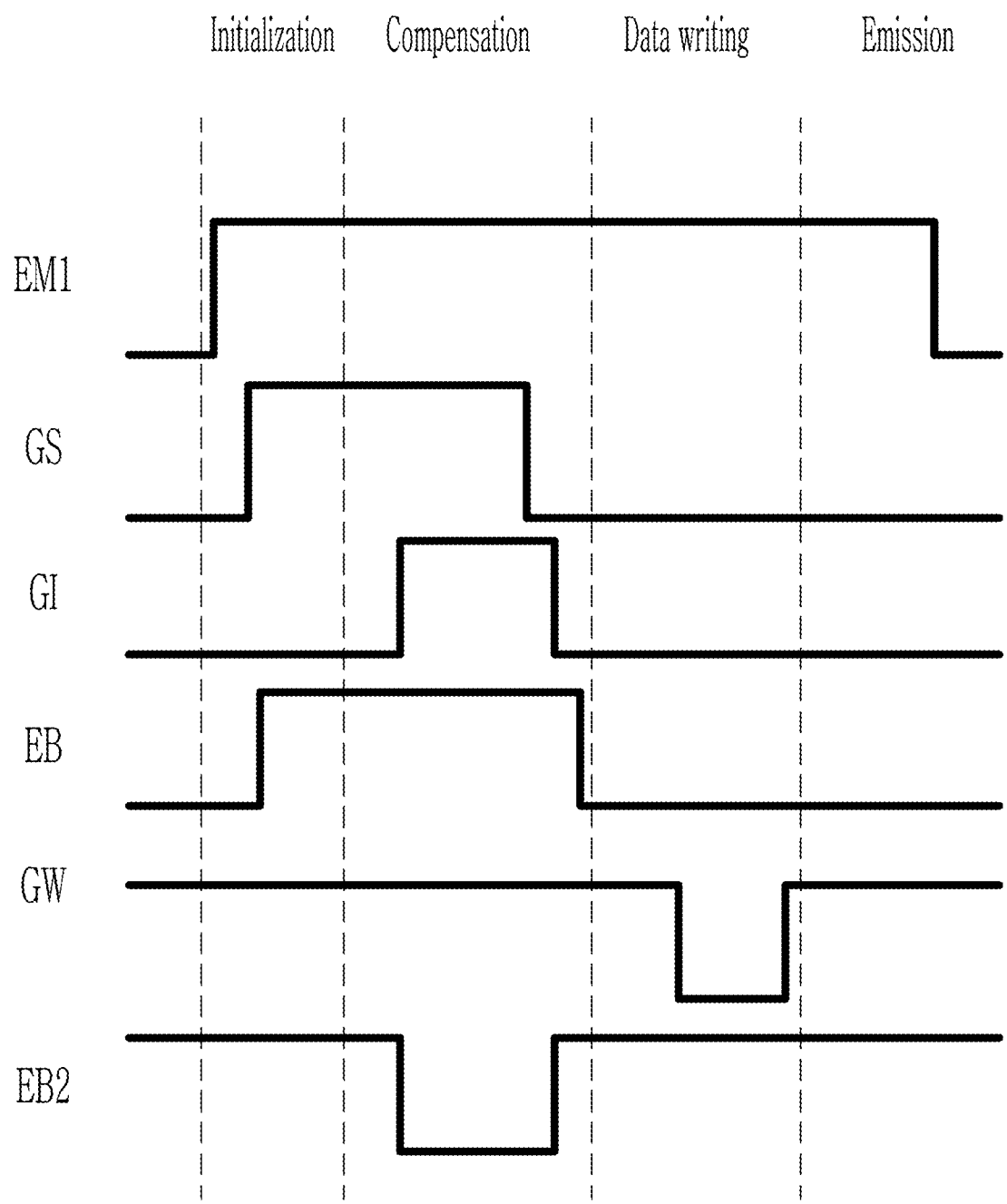
FIG. 19 illustrates a waveform diagram showing a signal applied to the pixel of FIG. 18 according to some embodiments.

FIG. 18 illustrates an equivalent circuit diagram of a pixel included in an emissive display device according to some embodiments, and FIG. 19 illustrates a waveform diagram showing a signal applied to the pixel of FIG. 18.

FIG. 18 illustrates a pixel in which the sixth transistor T6 is omitted in the embodiments illustrated with respect to FIG. 14.

Referring to FIG. 19, application timings of the fourth scan signal EB and the fifth scan signal EB2 may be different from those of FIG. 15.

That is, a gate-on voltage (high voltage) is applied to the fourth scan signal EB during the initialization period and the compensation period, and the gate-on voltage (low voltage) is applied to the fifth scan signal EB2 only during the compensation period.

During the initialization period, a gate-on voltage (high voltage) is applied to the second scan signal GS and the fourth scan signal EB. As a result, the third transistor T3 is turned on so that the first electrode of the driving transistor T1 is connected to the first node through the third transistor T3, and the seventh transistor T7 is also turned on to apply the initialization voltage Vaint to one electrode of the light emitting diode LED.

Thereafter, during the compensation period, a gate-on voltage is additionally applied to each of the third scan signal GI and the fifth scan signal EB2. As a result, the fourth transistor T4 and the eighth transistor T8 are additionally turned on. Accordingly, the fourth transistor T4 is turned on to change a portion connected to the second electrode of the fourth transistor T4 (the second electrode of the storage capacitor Cst and the gate electrode of the driving transistor T1) to the reference voltage Vref.

In addition, the eighth transistor T8 is turned on so that the bias voltage On-bias is transferred to the first electrode of the driving transistor T1, and the bias voltage On-bias is transferred to the first node through the turned-on third transistor T3 and is stored in the first electrode of the storage capacitor Cst. In this case, it is turned on with the voltage (reference voltage Vref) of the gate electrode of the driving transistor T1, and thus a voltage value of the first electrode of the storage capacitor Cst gradually decreases from the bias voltage On-bias. When the voltage value of the first electrode of the driving transistor T1 is higher than the reference voltage Vref by the threshold voltage Vth, as the driving transistor T1 is turned off, a corresponding voltage is stored in the first electrode of the storage capacitor Cst.

Thereafter, during the writing period, the data voltage Vdata is transferred into the pixel, and thereafter, during the emission period, the emission control signal EM is changed to a low voltage to turn on the fifth transistor T5 so that the output current of the driving transistor T1 is transmitted to the light emitting diode LED and light is emitted. Although the sixth transistor T6 is not included in the embodiments illustrated with respect to FIG. 18, operations of the writing period and the emission period may be the same as described in FIG. 1 and FIG. 2.

Hereinafter, another modification of FIG. 1 and FIG. 2 will be described with reference to FIG. 20 to FIG. 22.

Figure 20:
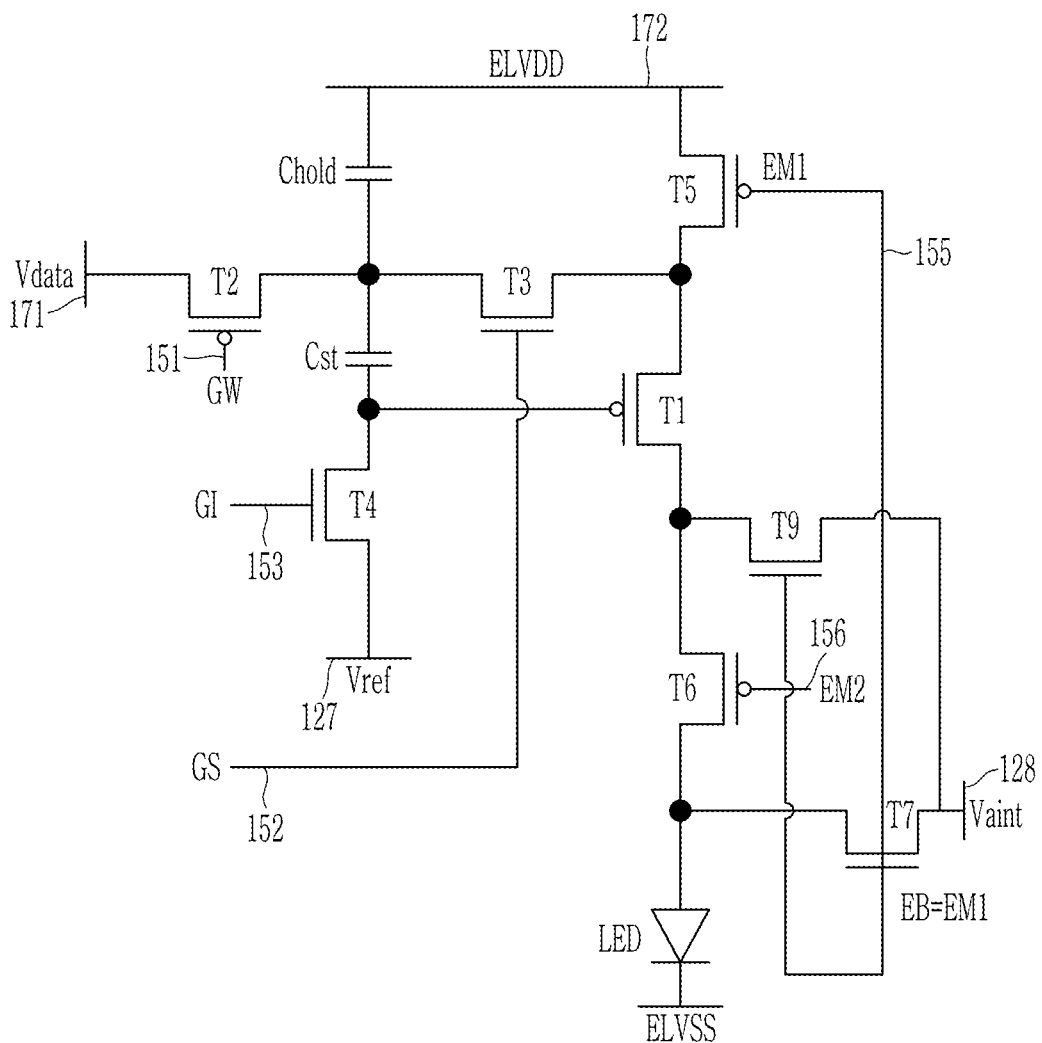
FIG. 20 and FIG. 21 each illustrate an equivalent circuit diagram of a pixel included in an emissive display device according to some embodiments.
Figure 21:
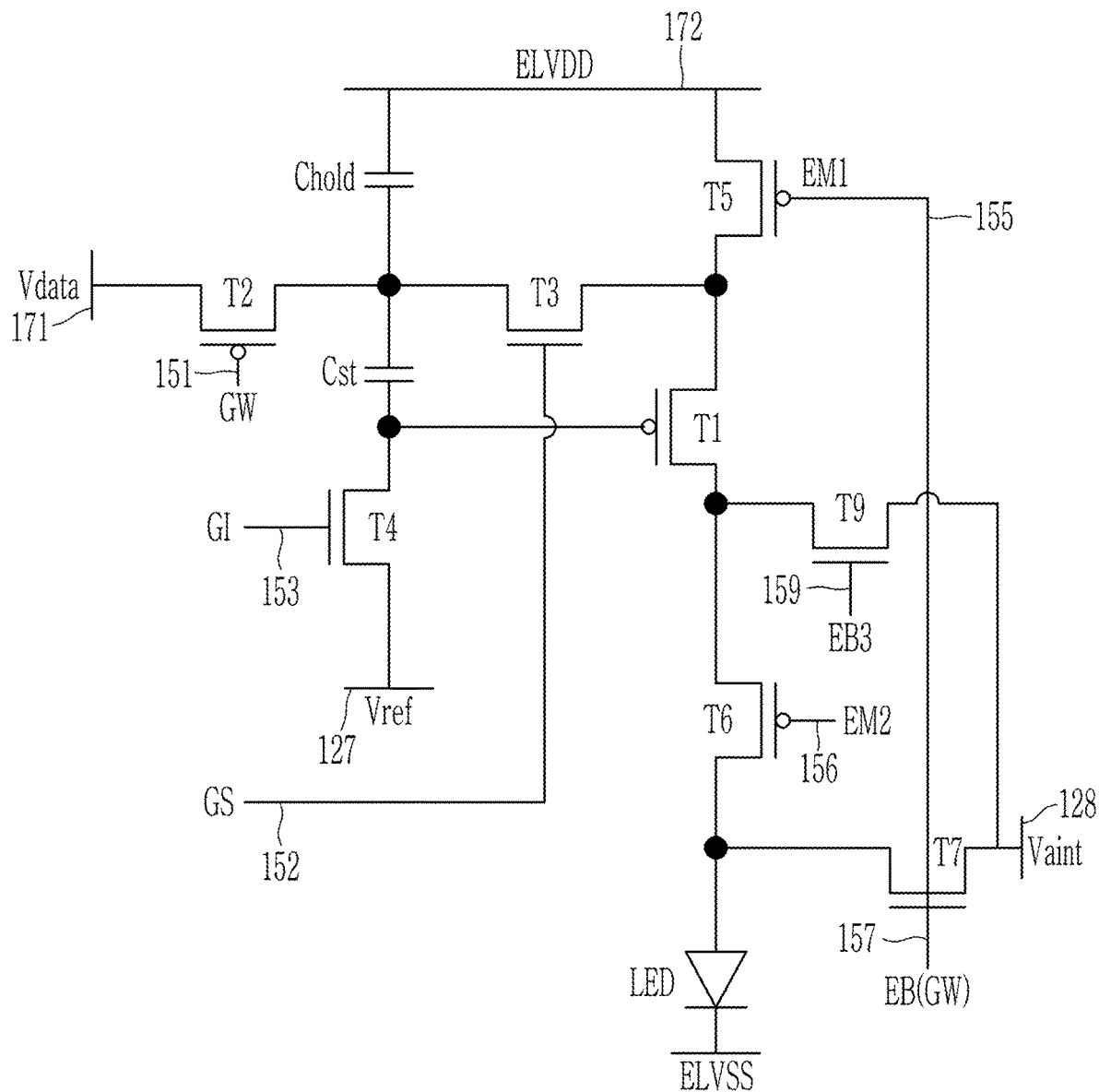
Figure 22:
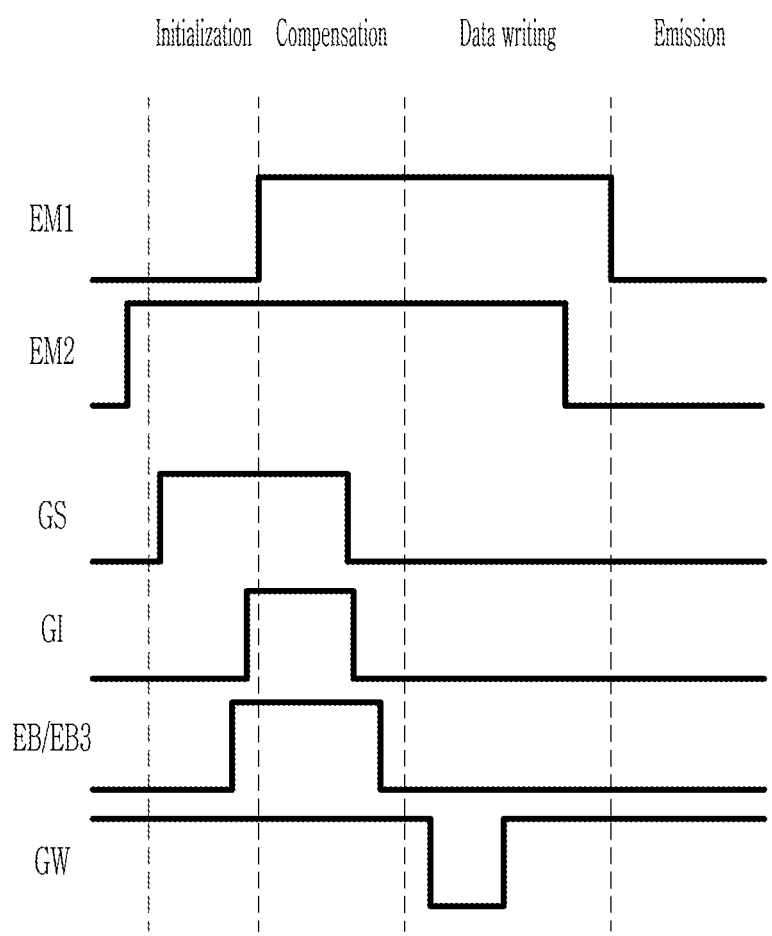
FIG. 22 illustrates a waveform diagram showing a signal applied to the pixel of FIG. 21 according to some embodiments.

FIG. 20 and FIG. 21 each illustrate an equivalent circuit diagram of a pixel included in an emissive display device according to some embodiments, and FIG. 22 illustrates a waveform diagram showing a signal applied to the pixel of FIG. 21.

FIG. 20 illustrates a pixel further including a ninth transistor T9 compared with the pixel of FIG. 1. In this case, the fifth transistor T5, the seventh transistor T7, and the ninth transistor T9 all have a structure controlled by the same first emission control signal EM1.

Embodiments illustrated with respect to FIG. 20 will be described in more detail as follows.

The ninth transistor T9, which is an n-type transistor, serves to initialize the second electrode of the driving transistor T1 and the first electrode of the sixth transistor T6 to the initialization voltage Vaint. A gate electrode of the ninth transistor T9 is connected to the first emission control line 155, a second electrode of the ninth transistor T9 is connected to the second electrode of the driving transistor T1 and the first electrode of the sixth transistor T6, and a first electrode of the ninth transistor T9 is connected to the initialization voltage line 128. When the ninth transistor T9 is turned on by a positive voltage in the first emission control signal EM1 flowing through the first emission control line 155, the initialization voltage Vaint is applied to the second electrode of the driving transistor T1 and the first electrode of the sixth transistor T6 to be initialized. According to some embodiments, the fifth transistor T5, the seventh transistor T7, and the ninth transistor T9 all receive the first emission control signal EM1, but have different transistor types, when the fifth transistor T5 is turned on, the seventh transistor T7 and the ninth transistor T9 are turned off, and when the seventh transistor T7 and the ninth transistor T9 are turned on, the fifth transistor T5 may be turned off.

On the other hand, in the embodiments illustrated with respect to FIG. 21, a signal other than the first emission control signal EM1 is applied to the gate electrode of the seventh transistor T7 and the gate electrode of the ninth transistor T9, unlike in FIG. 20. That is, the gate electrode of the seventh transistor T7 is connected to the fourth scan line 157 to receive the fourth scan signal EB, and the gate electrode of the ninth transistor T9 is connected to the sixth scan line 159 to receive a sixth scan signal EB6.

The pixel of FIG. 20 may receive a signal having a same waveform as that of FIG. 2 because the applied signal is the same as that of FIG. 1. In contrast, the pixel of FIG. 21 has a necessary scan signal so that the applied signal may be the same as that of FIG. 22.

In the waveform diagram of FIG. 22, the gate-on voltage (high voltage) is applied to the fourth scan signal EB and the sixth scan signal EB3 only during the compensation period, and the gate-on voltage (low voltage) is applied to the third scan signal GI only during the compensation period.

During the initialization period, a gate-on voltage (high voltage) is applied to the second scan signal GS. As a result, the third transistor T3 is turned on so that the first electrode of the driving transistor T1 is connected to the first node through the third transistor T3.

Thereafter, during the compensation period, a gate-on voltage is additionally applied to each of the third scan signal GI, the fourth scan signal EB, and the sixth scan signal EB3. As a result, the fourth transistor T4, the seventh transistor T7, and the ninth transistor T9 are additionally turned on. Accordingly, the fourth transistor T4 is turned on to change a portion connected to the second electrode of the fourth transistor T4 (the second electrode of the storage capacitor Cst and the gate electrode of the driving transistor T1) to the reference voltage Vref. In addition, the seventh transistor T7 is also turned on to apply the initialization voltage Vaint to one electrode of the light emitting diode LED, and the ninth transistor T9 is also turned on so that the initialization voltage Vaint is also applied to the second electrode of the driving transistor T1.

During the compensation period, the driving voltage ELVDD applied through the fifth transistor T5 is transferred to the first node, and due to the turned-on driving transistor T1, a voltage value of the first electrode of the storage capacitor Cst gradually decreases from the driving voltage ELVDD. When the voltage value of the first electrode of the driving transistor T1 is higher than the reference voltage Vref by the threshold voltage Vth, as the driving transistor T1 is turned off, a corresponding voltage is stored in the first electrode of the storage capacitor Cst.

Thereafter, during the writing period, the data voltage Vdata is transferred into the pixel, and thereafter, during the emission period, the emission control signal EM is changed to a low voltage to turn on the fifth transistor T5 so that the output current of the driving transistor T1 is transmitted to the light emitting diode LED and light is emitted. Although the sixth transistor T6 is not included in the embodiments illustrated with respect to FIG. 18, operations of the writing period and the emission period may be the same as described in FIG. 1 and FIG. 2.

Hereinafter, another modification of FIG. 1 and FIG. 2 will be described with reference to FIG. 23 and FIG. 24.

Figure 23:
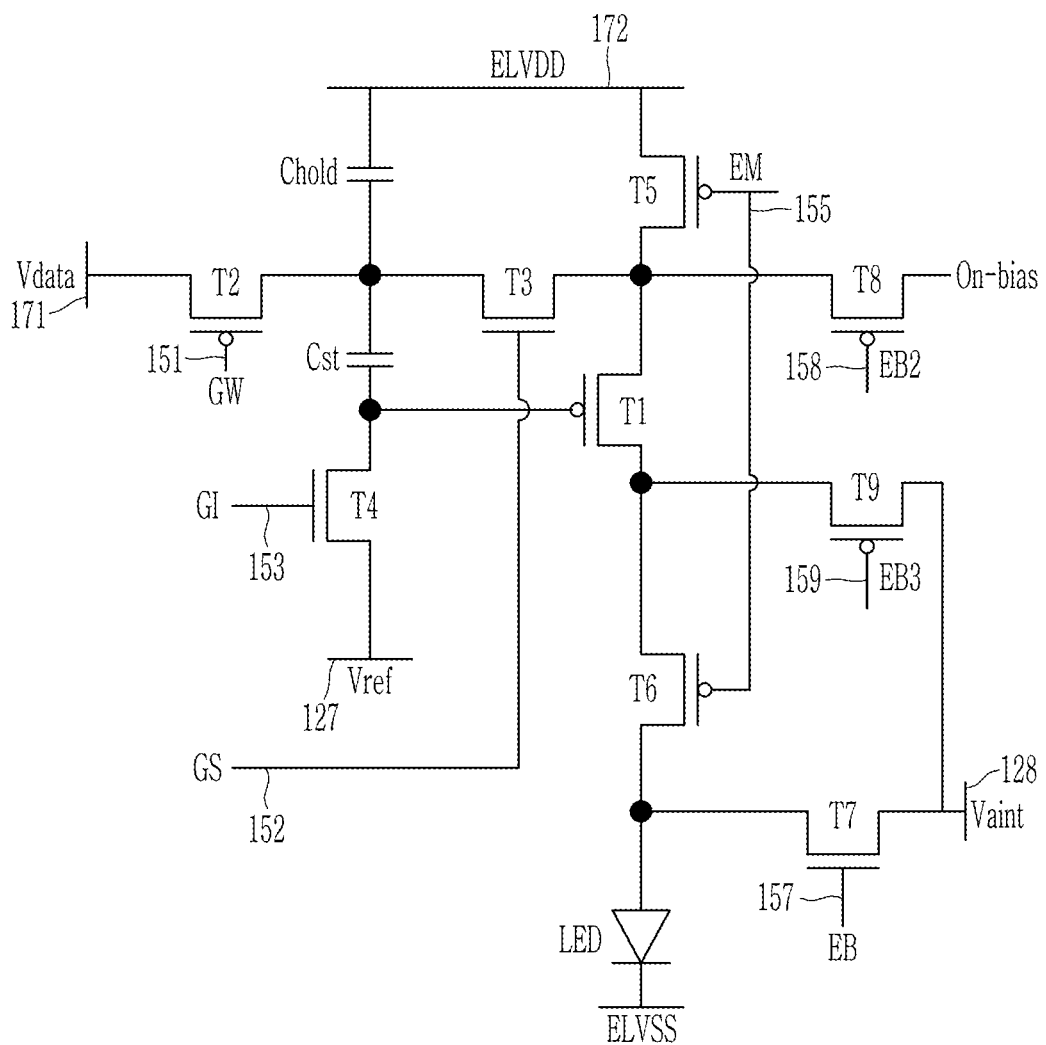
FIG. 23 illustrates an equivalent circuit diagram of a pixel included in an emissive display device according to some embodiments.
Figure 24:
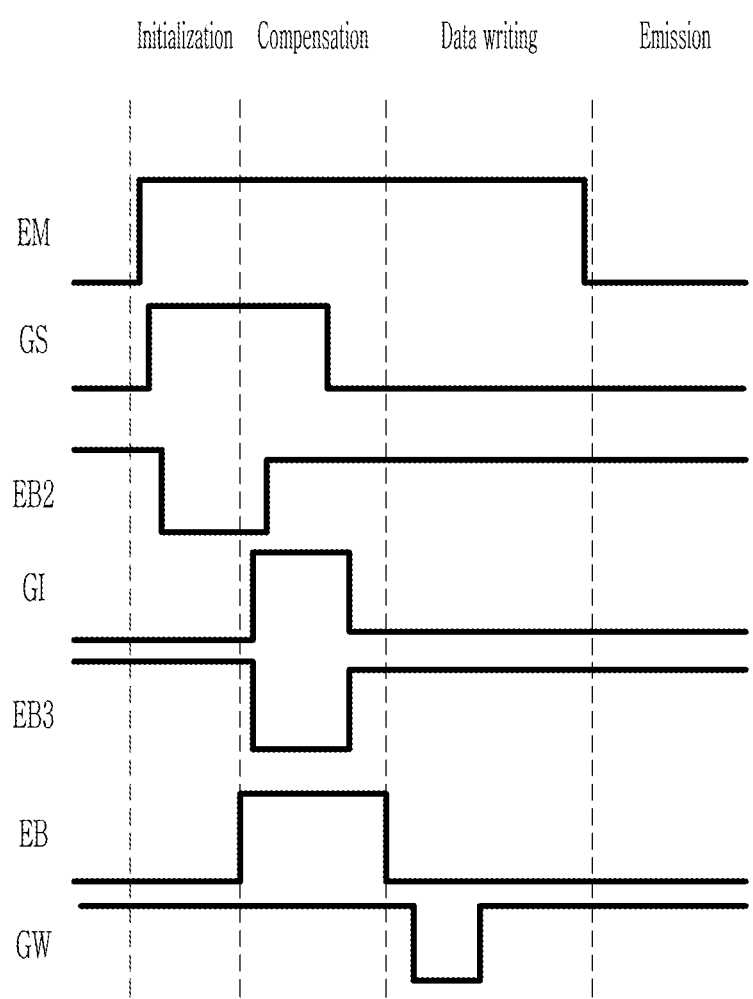
FIG. 24 illustrates a waveform diagram showing a signal applied to the pixel of FIG. 23 according to some embodiments.

FIG. 23 illustrates an equivalent circuit diagram of a pixel included in an emissive display device according to some embodiments, and FIG. 24 illustrates a waveform diagram showing a signal applied to the pixel of FIG. 23.

The pixel of FIG. 23 is a pixel further including a ninth transistor T9 which is a p-type transistor compared with the embodiments illustrated with respect to FIG. 16.

The ninth transistor T9, which is a p-type transistor, serves to initialize the second electrode of the driving transistor T1 and the first electrode of the sixth transistor T6 to the initialization voltage Vaint. The gate electrode of the ninth transistor T9 is connected to the sixth scan line 159 to receive the sixth scan signal EB3, the second electrode of the ninth transistor T9 is connected to the second electrode of the driving transistor T1 and the first electrode of the sixth transistor T6, and the first electrode of the ninth transistor T9 is connected to the initialization voltage line 128.

Referring to FIG. 24, a gate-on voltage is applied to the second scan signal GS and the fifth scan signal EB2 during the initialization period. As a result, the third transistor T3 is turned on so that the first electrode of the driving transistor T1 is connected to the first node through the third transistor T3, and the eighth transistor T8 is also turned on to transmit the bias voltage On-bias to the first electrode of the driving transistor T1. In this case, the fifth transistor T5 is turned off to transmit only the bias voltage On-bias to the first electrode of the driving transistor T1, and a voltage of the first node is also initialized to the bias voltage On-bias through the third transistor T3.

Thereafter, during the compensation period, the fifth scan signal EB2 is changed to a gate-off voltage (high voltage), and a gate-on voltage is additionally applied to each of the third scan signal GI and the sixth scan signal EB3. As a result, the fourth transistor T4 is turned on to change a portion connected to the second electrode of the fourth transistor T4 (the second electrode of the storage capacitor Cst and the gate electrode of the driving transistor T1) to the reference voltage Vref. Accordingly, the driving transistor T1 is turned on, and the ninth transistor T9 is also turned on during the compensation period so that the second electrode of the driving transistor T1 is changed to the initialization voltage Vaint. As a voltage of the first electrode of the storage capacitor Cst leaks through the third transistor T3 and the driving transistor T1, a voltage value of the first electrode of the storage capacitor Cst gradually decreases from the bias voltage On-bias value, and goes lower until the driving transistor T1 is turned off. When the voltage value of the first electrode of the driving transistor T1 is higher than the reference voltage Vref by the threshold voltage Vth, as the driving transistor T1 is turned off, a corresponding voltage is stored in the first electrode of the storage capacitor Cst.

Thereafter, during the writing period, the data voltage Vdata is transferred into the pixel, and thereafter, during the emission period, the emission control signal EM is changed to a low voltage to turn on the fifth transistor T5 so that the output current of the driving transistor T1 is transmitted to the light emitting diode LED and light is emitted. Although the sixth transistor T6 is not included in the embodiments illustrated with respect to FIG. 18, operations of the writing period and the emission period may be the same as described in FIG. 1 and FIG. 2.

Hereinafter, another modification of FIG. 1 and FIG. 2 will be described with reference to FIG. 25 and FIG. 26.

Figure 25:
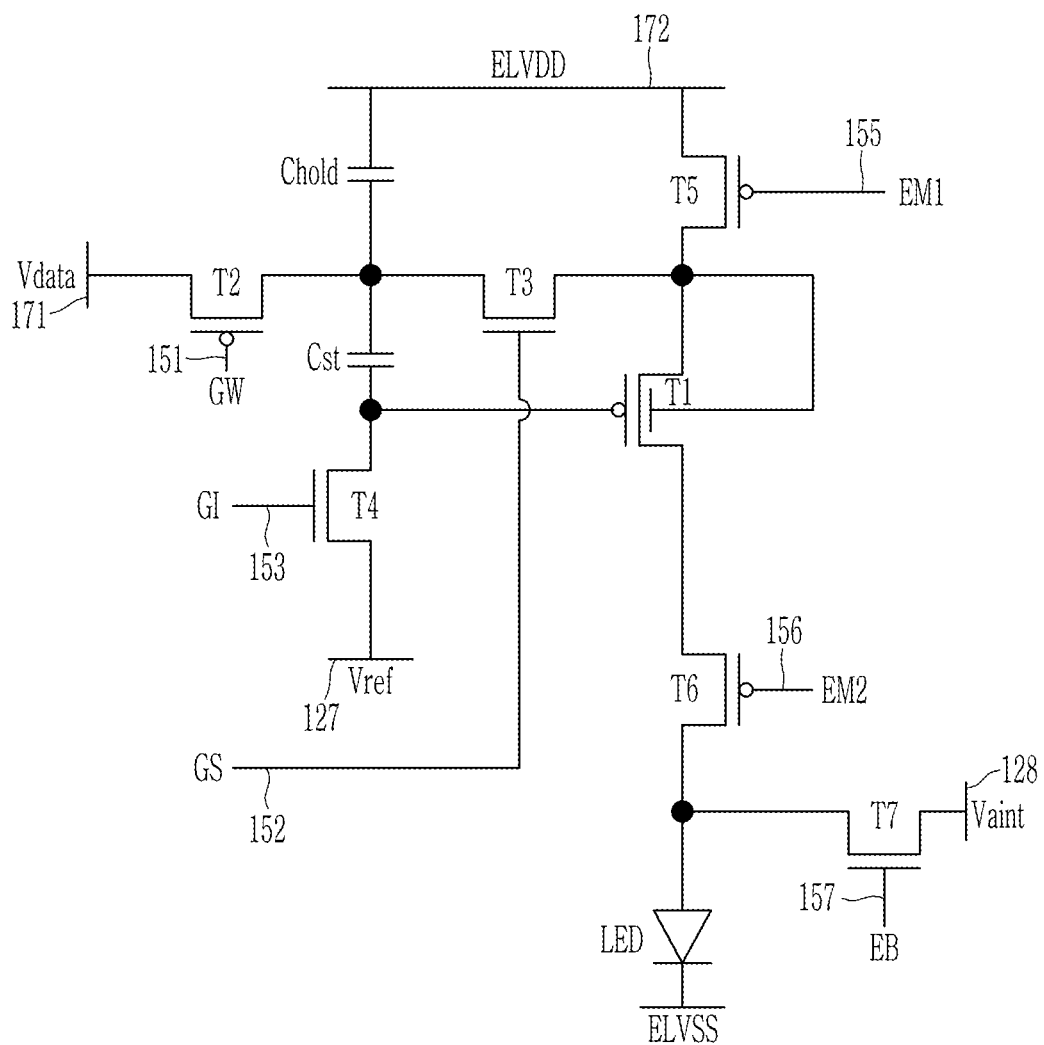
FIG. 25 illustrates an equivalent circuit diagram of a pixel included in an emissive display device according to some embodiments.
Figure 26:
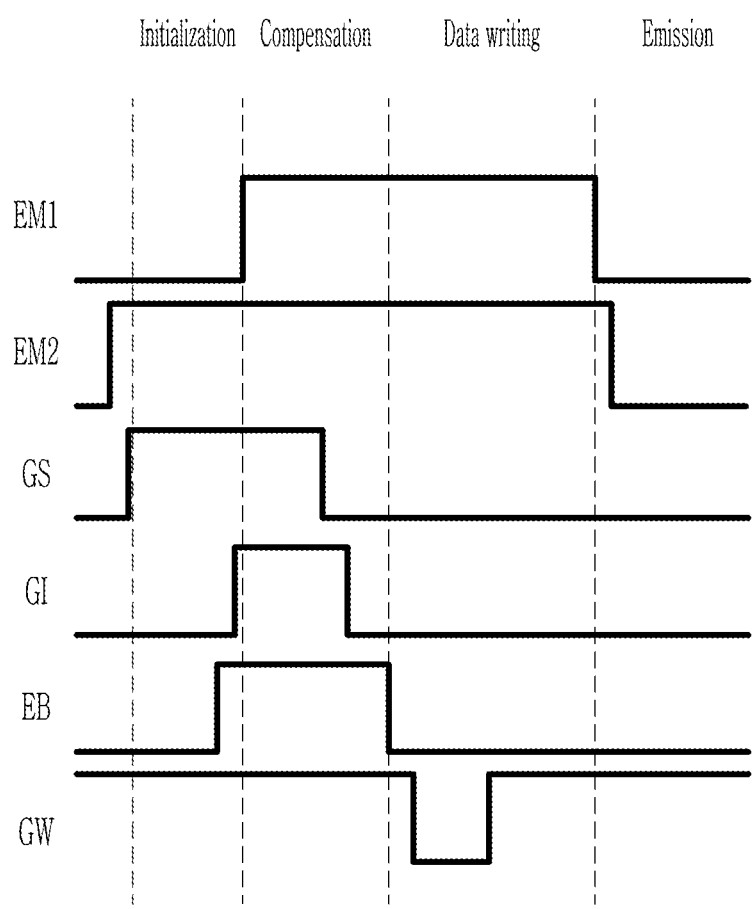
FIG. 26 illustrates a waveform diagram showing a signal applied to the pixel of FIG. 25 according to some embodiments.

FIG. 25 illustrates an equivalent circuit diagram of a pixel included in an emissive display device according to some embodiments, and FIG. 26 illustrates a waveform diagram showing a signal applied to the pixel of FIG. 25.

FIG. 25 illustrates embodiments in which the driving transistor T1 has a structure further including an additional gate electrode connected to the first electrode of the driving transistor T1 compared with the embodiments illustrated with respect to FIG. 12. In this case, an additional gate electrode overlapping the channel 1132 of the driving transistor T1 is further formed, and in this case, the additional gate electrode may have a structure that is connected to the first electrode of the driving transistor T1.

The pixel according to the embodiments illustrated with respect to FIG. 25 has the same signal as that of the pixel of FIG. 12, so the waveform diagram of FIG. 26 may have a same waveform as FIG. 13, and the pixel of FIG. 12 and the pixel of FIG. may perform a same operation.

In the embodiments illustrated with respect to FIG. 1 to FIG. 26, additionally, at least one of the third transistor T3, the fourth transistor T4, or the seventh transistor T7 may be changed to a p-type transistor.

Meanwhile, a circuit structure of a pixel according to some embodiments including only an n-type transistor will be described in more detail with reference to FIG. 27.

Figure 27:
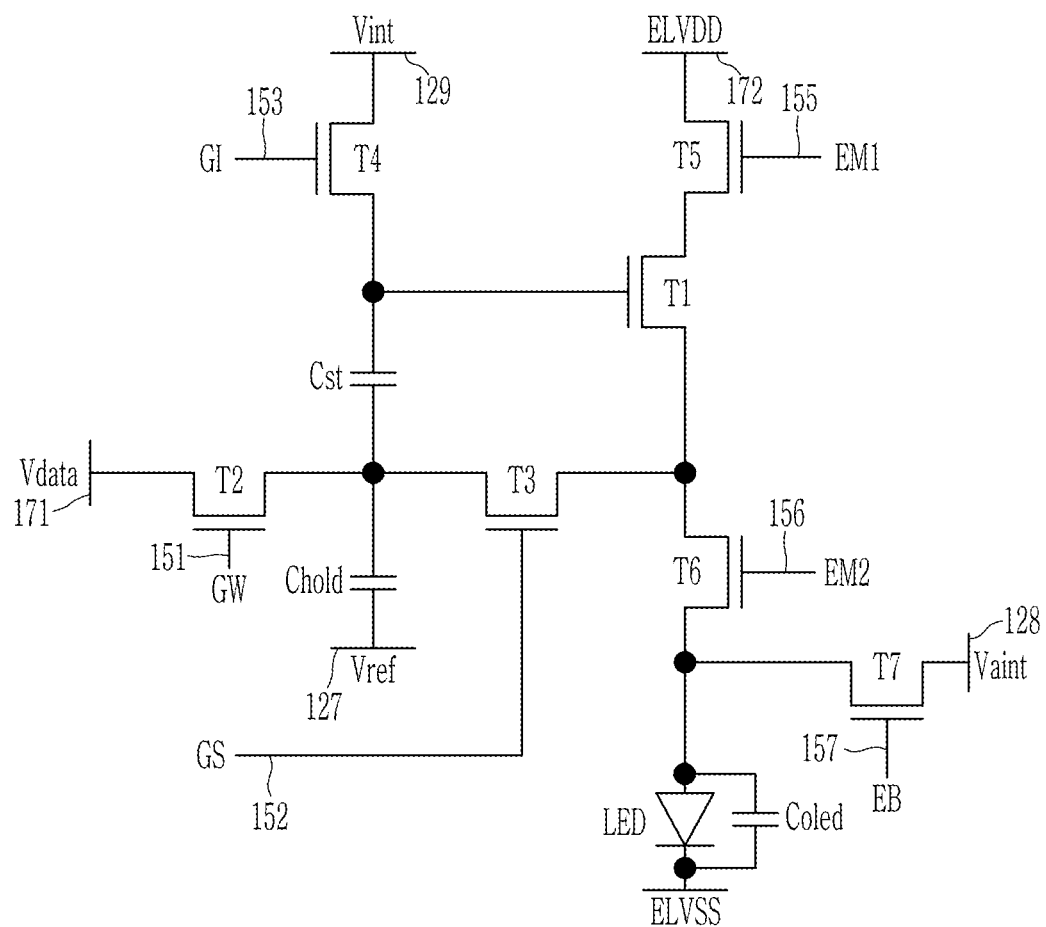
FIG. 27 illustrates an equivalent circuit diagram of a pixel included in an emissive display device according to some embodiments.

FIG. 27 illustrates an equivalent circuit diagram of a pixel included in an emissive display device according to some embodiments.

One pixel according to FIG. 27 includes a plurality of transistors T1, T2, T3, T4, T5, T6, and T7, a storage capacitor Cst, a hold capacitor Chold, and a light emitting diode LED which are connected to wires 127, 128, 129, 151, 152, 153, 155, 156, 157, 171, and 172. Herein, the transistors and the capacitor excluding the light emitting diode LED may constitute a pixel circuit unit, and one pixel may include the pixel circuit unit and the light emitting diode. In FIG. 27, the diode capacitor Coled formed at opposite ends of the light emitting diode LED is additionally illustrated, the diode capacitor Coled may not be included in the pixel circuit unit, and the diode capacitor Coled may be omitted. The transistors T1, T2, T3, T4, T5, T6, and T7 are all formed by using an n-type transistor, and the n-type transistor may be formed by using an oxide semiconductor transistor including an oxide semiconductor. Herein, the n-type transistor may be a transistor that is turned on when a relatively high voltage of a gate electrode is applied.

A plurality of wires 127, 128, 129, 151, 152, 153, 155, 156, 157, 171, and 172 are connected to one pixel PX. The wires include a reference voltage line 127, an initialization voltage line 128, a second initialization voltage line 129, a first scan line 151, a second scan line 152, a third scan line 153, a first emission control line 155, a second emission control line 156, a fourth scan line 157, a data line 171, and a driving voltage line 172. Additionally, a common voltage line transferring a driving low voltage ELVSS may be connected to one side of the light emitting diode LED.

The first scan line 151 transmits a first scan signal GW to the second transistor T2. The second scan line 152 transmits a second scan signal GS to the third transistor T3. The third scan line 153 transfers the third scan signal GI to the fourth transistor T4, the first emission control line 155 transfers the first emission control signal EM1 to the fifth transistor T5, the second light emission control line 156 transmits the second light emission control signal EM2 to the sixth transistor T6, and the fourth scan line 157 transfers the fourth scan signal EB to the seventh transistor T7.

The data line 171 is a line that transfers the data voltage Vdata generated by the data driver, and accordingly, a magnitude of the emission current transferred to the light emitting diode LED is changed, so that luminance of the light emitting diode LED is also changed. The driving voltage line 172 applies a driving voltage ELVDD. The reference voltage line 127 transfers the reference voltage Vref, the initialization voltage line 128 transfers the initialization voltage Vaint, and the second initialization voltage line 129 transfers the second initialization voltage Vint. According to some embodiments, the voltages applied to the driving voltage line 172, the reference voltage line 127, the initialization voltage line 128, and the second initialization voltage line 129 may each be a constant voltage. Herein, the reference voltage Vref may be the same as or similar to the initialization voltage Vaint, and the second initialization voltage Vint may be the same as or similar to the driving voltage ELVDD. However, a voltage value in the embodiments is not limited thereto.

The driving transistor T1 (also referred to as a first transistor), which is an n-type transistor, may include an oxide semiconductor as a semiconductor layer. It is a transistor that adjusts a magnitude of an emission current outputted to one electrode of the light emitting diode LED depending on a magnitude of a voltage of a gate electrode of the driving transistor T1 (that is, a voltage stored in the storage capacitor Cst). Brightness of the light emitting diode LED may be adjusted depending on the magnitude of the emission current outputted to one electrode of the light emitting diode LED, and thus emission luminance of the light emitting diode LED may be adjusted depending on a data voltage Vdata applied to the pixel. For this purpose, a first electrode of the driving transistor T1 is connected to the driving voltage line 172 via the fifth transistor T5 by being positioned to receive the driving voltage ELVDD. Meanwhile, the second electrode of the driving transistor T1 outputs an emission current to the light emitting diode LED, and is connected to one electrode of the light emitting diode LED via the sixth transistor T6 (hereinafter also referred to as an output control transistor). In addition, the second electrode of the driving transistor T1 is also connected to a second electrode of the third transistor T3. The data voltage Vdata is applied to the second electrode of the driving transistor T1 through the second transistor T2 and the third transistor T3. Meanwhile, a gate electrode of the driving transistor T1 is connected to a first electrode (hereinafter referred to as a 'second storage electrode') of the storage capacitor Cst. Accordingly, the voltage of the gate electrode of the driving transistor T1 changes depending on a voltage stored in the storage capacitor Cst, and an emission current outputted by the driving transistor T1 changes accordingly. The storage capacitor Cst serves to maintain a voltage of the gate electrode of the driving transistor T1 to be constant during one frame. Meanwhile, a gate electrode of the driving transistor T1 may also be connected to the fourth transistor T4, to be initialized by receiving the second initialization voltage Vref.

The second transistor T2, which is an n-type transistor, may include an oxide semiconductor as a semiconductor layer. The second transistor T2 is a transistor that receives the data voltage Vdata into the pixel. A gate electrode of the second transistor T2 may be connected to the first scan line 151. A first electrode of the second transistor T2 is connected to the data line 171. The second electrode of the second transistor T2 is connected to a first electrode of the third transistor T3, a first electrode of the storage capacitor Cst (hereinafter referred to as a 'first storage electrode'), and a second electrode of the hold capacitor Chold. Hereinafter, a node to which the second electrode of the second transistor T2, the first electrode of the third transistor T3, the first electrode of the storage capacitor Cst, and the second electrode of the hold capacitor Chold are connected is also called a first node. When the second transistor T2 is turned on by the positive voltage of the first scan signal GW transferred through the first scan line 151, the data voltage Vdata transferred through the data line 171 is transferred to the first electrode of the third transistor T3, and the data voltage Vdata is transferred to the first electrode of the driving transistor T1 through the third transistor T3.

The third transistor T3, which is an n-type transistor, may include an oxide semiconductor as a semiconductor layer. The third transistor T3 electrically connects the second electrode of the driving transistor T1 and the second electrode of the second transistor T2. As a result, it is a transistor that allows the data voltage Vdata to be transferred to the second electrode of the driving transistor T1. A gate electrode of the third transistor T3 is connected to the second scan line 152, and a first electrode of the third transistor T3 is connected to the first node, to be connected to the second electrode of the second transistor T2, a first electrode of the storage capacitor Cst, and a second electrode of the hold capacitor Chold. A second electrode of the third transistor T3 is connected to the second electrode of the driving transistor T1 and the first electrode of the sixth transistor T6. The third transistor T3 is turned on by a positive voltage of the second scan signal GS transferred through the second scan line 152 so as to connect the second electrode of the driving transistor T1 and the second electrode of the second transistor T2.

The fourth transistor T4, which is an n-type transistor, may include an oxide semiconductor as a semiconductor layer. The fourth transistor T4 serves to transfer the second initialization voltage Vint to the gate electrode of the driving transistor T1 and the second storage electrode of the storage capacitor Cst. A gate electrode of the fourth transistor T4 is connected to the third scan line 153, and a first electrode of the fourth transistor T4 is connected to the second initialization voltage line 129. A second electrode of the fourth transistor T4 is connected to the second storage electrode of the storage capacitor Cst and the gate electrode of the driving transistor T1. The fourth transistor T4 is turned on by a positive voltage of the third scan signal GI transferred through the third scan line 153, and in this case, the second initialization voltage Vint is transferred to the gate electrode of the driving transistor T1 and the second storage electrode of the storage capacitor Cst.

The fifth transistor T5 and the sixth transistor T6, which are n-type transistors, have an oxide semiconductor as a semiconductor layer.

The fifth transistor T5 serves to transfer the driving voltage ELVDD to the driving transistor T1. A gate electrode of the fifth transistor T5 is connected to the first emission control line 155, a first electrode of the fifth transistor T5 is connected to the driving voltage line 172, and a second electrode of the fifth transistor T5 is connected to the first electrode of the driving transistor T1.

The sixth transistor T6 serves to transfer an emission current outputted from the driving transistor T1 to the light emitting diode. A gate electrode of the sixth transistor T6 is connected to the second emission control line 156, a first electrode of the sixth transistor T6 is connected to the second electrode of the driving transistor T1, and a second electrode of the sixth transistor T6 is connected to one electrode of the light emitting diode LED.

The seventh transistor T7, which is an n-type transistor, may include an oxide semiconductor as a semiconductor layer. The seventh transistor T7 serves to initialize an electrode of the light emitting diode LED. Hereinafter, the seventh transistor T7 is also referred to as a light emitting diode initialization transistor. The gate electrode of the seventh transistor T7 is connected to the fourth scan line 157, the second electrode of the seventh transistor T7 is connected to one electrode of the light emitting diode LED, and the first electrode of the seventh transistor T7 is connected to the initialization voltage line 128. When the seventh transistor T7 is turned on by a positive voltage in the fourth scan signal EB flowing through the fourth scan line 157, the initialization voltage Vaint is applied to one electrode of the light emitting diode LED to be initialized.

The first electrode of the storage capacitor Cst is connected to the first node, to be connected with the second electrode of the second transistor T2, the first electrode of the third transistor T3, and the second electrode of the hold capacitor Chold, and the second electrode thereof is connected to the gate electrode of the driving transistor T1 and the second electrode of the fourth transistor T4.

The first electrode of the hold capacitor Chold receives the reference voltage Vref, and the second electrode is connected to the first node to be connected to the second electrode of the second transistor T2, the first electrode of the third transistor T3, and the first electrode of the storage capacitor Cst.

Meanwhile, a diode capacitor Coled, which is a capacitor connected to two electrodes of the light emitting diode LED, may not be included according to some embodiments.

In FIG. 27, although it has been described that one pixel PX includes seven transistors T1 to T7 and three capacitors (storage capacitor Cst, hold capacitor Chold, and diode capacitor Coled), the present disclosure is not limited thereto, and various modifications will be described with reference to FIG. 29 to FIG. 33.

In the above, a circuit structure of a pixel according to some embodiments has been described with reference to FIG. 27.

Hereinafter, a waveform of a signal applied to the pixel of FIG. 27 and an operation of the pixel depending on the waveform will be described with reference to FIG. 28.

Figure 28:
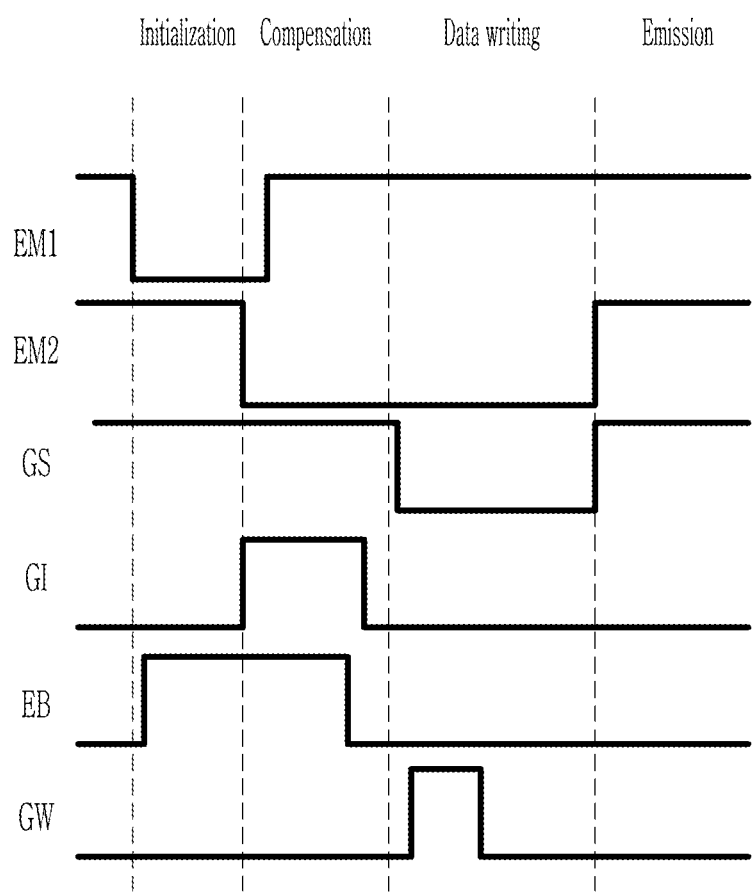
FIG. 28 illustrates a waveform diagram showing a signal applied to the pixel of FIG. 27 according to some embodiments.

FIG. 28 illustrates a waveform diagram showing a signal applied to the pixel of FIG. 27.

Referring to FIG. 28, when a signal applied to a pixel is divided into periods, it may be divided into an initialization period, a compensation period, a writing period, and an emission period. Meanwhile, all of the transistors included in the embodiments illustrated with respect to FIG. 27 are formed by using n-type transistors, a high voltage may be a gate-on voltage and a low voltage may be a gate-off voltage.

First, an emission section is a section in which the light emitting diode LED emits light, and a gate-on voltage (high level voltage) is applied in a first emission signal EM1 and a second emission signal EM2 to turn on the fifth transistor T5 and the sixth transistor T6. When the fifth transistor T5 is turned on so that the driving voltage ELVDD is transferred to the driving transistor T1, an output current is generated depending on a voltage of a gate electrode of the driving transistor T1. The output current of the driving transistor T1 is transmitted to the light emitting diode LED through the turned-on sixth transistor T6, to enable the light emitting diode LED to emit light. In FIG. 28, an emission period during which the first emission signal EM1 and the second emission signal EM2 apply the gate-on voltage (low level voltage) is hardly illustrated, but in reality, the emission period has a longest time. However, the emission period is simply illustrated in FIG. 28 without specific explanation because only the above simple operation is performed.

When the emission period ends, the initialization period is entered.

As the first emission signal EM1 is changed to a gate-off voltage (low level voltage), the emission period ends. The initialization period is entered while the second scan signal GS is changed to a gate-on voltage (high-level voltage), and in this case, the second emission signal EM2 and the second scan signal GI maintain a high level voltage.

During the initialization period, the third transistor T3 is turned on by the second scan signal GS, the seventh transistor T7 is turned on by the fourth scan signal EB, and the turn-on state of the sixth transistor T6 is maintained by the second emission signal EM2. As a result, the second electrode of the driving transistor T1 is connected to the first node by the turned-on third transistor T3, and the initialization voltage Vaint is applied to one electrode of the light emitting diode LED by the seventh transistor T7. In this case, the second electrode of the driving transistor T1 is connected to one electrode of the light emitting diode LED by the sixth transistor T6, and the initialization voltage Vaint transferred through the seventh transistor T7 is transferred to the first node through the sixth transistor T6 and the third transistor T3. A voltage of the first electrode of the storage capacitor Cst and a voltage of a second electrode of the hold capacitor Chold are initialized to the initialization voltage Vaint.

When the initialization period ends, the compensation period is entered.

The first light emission signal EM1 is changed to a gate-on voltage again and the second light emission signal EM2 is changed to a gate-off voltage, so the initialization period ends and the compensation period is entered. In this case, the third scan signal GI is changed to a gate-on voltage (high level voltage), and the second scan signal GS and the fourth scan signal EB maintain the gate-on voltage. As a result, the fifth transistor T5 is turned on again, the sixth transistor T6 is turned off, and the fourth transistor T4 is also turned on. In this case, turn-on states of the third transistor T3 and the seventh transistor T7 are maintained.

A voltage of the gate electrode of the driving transistor T1 becomes the second initialization voltage Vint by the turned-on fourth transistor T4, and the second initialization voltage Vint may be a voltage that causes the driving transistor T1 to be turned on. In addition, the driving voltage ELVDD is transferred to the first electrode of the driving transistor T1 by the turned-on fifth transistor T5, and then passes through the turned-on driving transistor T1 and is outputted to the second electrode of the driving transistor T1. In this case, the third transistor T3 is also turned on, and thus the voltage of the first electrode of the storage capacitor Cst increases. When the voltage of the first electrode of the storage capacitor Cst increases and is lower than the voltage of the gate electrode of the driving transistor T1 (i.e., second initialization voltage Vint) by the threshold voltage Vth, the driving transistor T1 is turned off, and the voltage at that time is stored in the first electrode of the storage capacitor Cst. Accordingly, the voltage of the first electrode of the storage capacitor Cst (i.e., voltage of the first node) may have a voltage value obtained by subtracting the threshold voltage Vth from the second initialization voltage Vint.

During the compensation period, the seventh transistor T7 maintains the turned-on state, and thus the voltage of one electrode of the light emitting diode LED is continuously maintained as the initialization voltage Vaint.

When the compensation period ends, the writing period is entered.

As the second scan signal GS, the third scan signal GI, and the fourth scan signal EB are changed to the gate-off voltage, the compensation period ends and the writing period is entered. Thereafter, the first scan signal GW is changed to a gate-on voltage (high level voltage), the second transistor T2 is turned on, and the data voltage Vdata is transferred to the first node.

A voltage value obtained by changing the voltage of the first node by the data voltage Vdata may be changed to Vdata−(Vaint+Vth), and a voltage of the second electrode of the storage capacitor Cst may also be changed by a maximum value of Vdata−(Vaint+Vth). As a result, a voltage value of the second electrode of the storage capacitor Cst may have a value of Vdata+Vth, and this value may be a voltage value of the gate electrode of the driving transistor T1. Vth among the voltage values of the gate electrode of the driving transistor T1 is used to turn on the driving transistor T1, and compensates for a different threshold voltage for each driving transistor T1. Only the data voltage Vdata, which is a remaining value among voltage values of the gate electrode of the driving transistor T1, is directly used by the driving transistor T1 to generate an output current.

In this case, the fifth transistor T5 is turned on and the driving voltage ELVDD is transferred to the driving transistor T1, and thus although the drive transistor T1 can produce an output current, the sixth transistor T6 is turned off, so as to not be transmitted to the light emitting diode LED.

Accordingly, in order to enter the emission period, when the sixth transistor T6 is also turned on to become the output current of the driving transistor T1 by applying a gate-on voltage (high level voltage) to the second emission signal EM2, the driving transistor T1 is transferred to the light emitting diode LED so that the light emitting diode LED emits light.

Meanwhile, according to some embodiments, the first light emitting signal EM1 may be changed to a gate-off voltage (low level voltage) during the writing period, and then the first emission signal EM1 may be changed to a gate-on voltage (high level voltage) again during the emission period.

Hereinafter, another modification of the embodiments illustrated with respect to FIG. 27 and FIG. 28 will be described with reference to FIG. 29 and FIG. 30.

Figure 29:
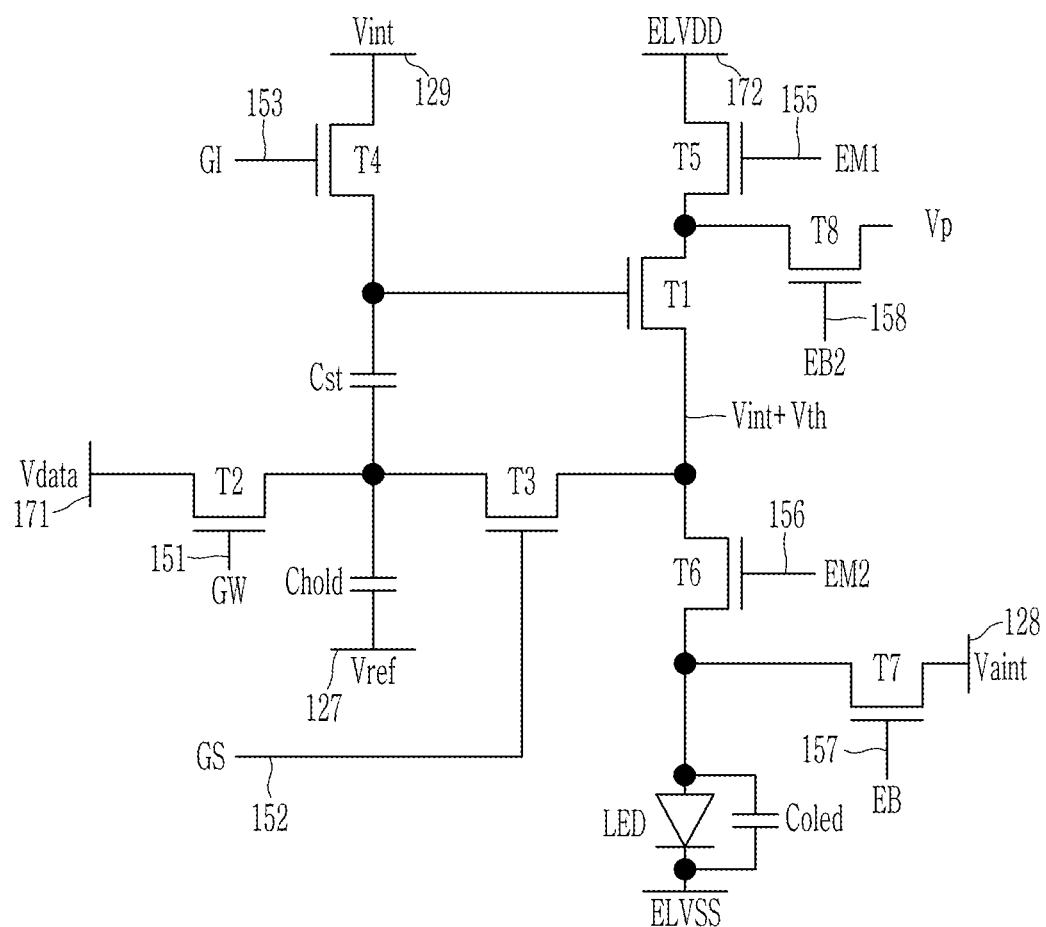
FIG. 29 illustrates an equivalent circuit diagram of a pixel included in an emissive display device according to some embodiments.
Figure 30:
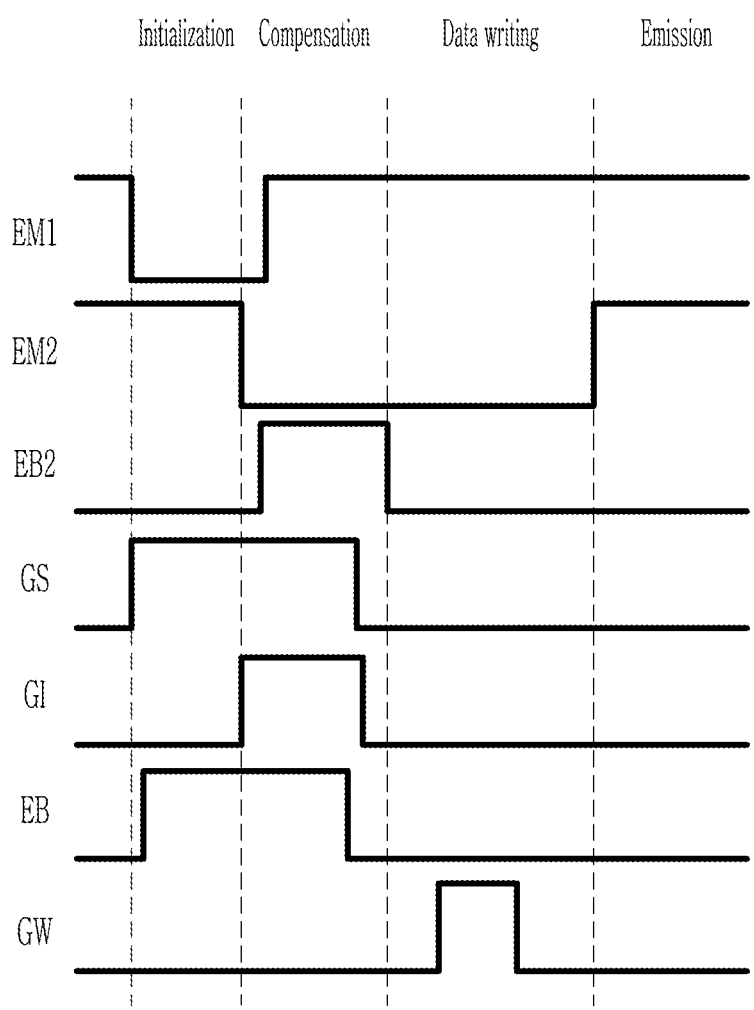
FIG. 30 illustrates a waveform diagram showing a signal applied to the pixel of FIG. 29 according to some embodiments.

FIG. 29 illustrates an equivalent circuit diagram of a pixel included in an emissive display device according to some embodiments, and FIG. 30 illustrates a waveform diagram showing a signal applied to the pixel of FIG. 29.

The pixel according to the embodiments illustrated with respect to FIG. 29 is different from the pixel of FIG. 27 in further including the eighth transistor T8.

In FIG. 29, the eighth transistor T8, which is an n-type transistor, may include an oxide semiconductor as a semiconductor layer. The eighth transistor T8 serves to transfer a bias voltage Vp to the first electrode of the driving transistor T1. Hereinafter, the eighth transistor T8 is also referred to as a bias transistor. A gate electrode of the eighth transistor T8 is connected to the fifth scan line 158 to receive the fifth scan signal EB2, a first electrode of the eighth transistor T8 receives the bias voltage Vp, and the second electrode of the eighth transistor T8 is connected to the first electrode of the driving transistor T1 and the second electrode of the fifth transistor T5.

The eighth transistor T8 may be turned on to change the bias voltage Vp the first electrode of the driving transistor T1 so that the voltage of the first electrode of the driving transistor T1 may be maintained at the bias voltage Vp, thereby preventing or reducing changes to a voltage relationship of each terminal of the driving transistor T1 and allowing the driving transistor T1 to generate a constant output current. In particular, when low frequency driving is performed, the driving transistor T1 must generate an output current for a long time by using one data voltage Vdata that is inputted through the second transistor T2, but as time goes by, while as the voltage relationship of each terminal of the driving transistor T1 is changed, an output current may be changed. However, by periodically applying the bias voltage Vp, the voltage relationship of the driving transistor T1 is not changed and an output current is kept constant.

The bias voltage Vp may have a constant voltage level, it may be a voltage at a level corresponding to the driving voltage ELVDD, and a different voltage may be set for each device depending on characteristics of the emissive display device.

Comparing FIG. 30 with FIG. 28, it can be seen that only the fifth scan signal EB2 is further added. The fifth scan signal EB2 applies a gate-on voltage (high voltage) only during the compensation period to turn on the eighth transistor T8, and during the compensation period, the voltage of the first electrode of the driving transistor T1 may be changed to the bias voltage Vp through the eighth transistor T8.

According to some embodiments, when the fifth scan signal EB2 applies the gate-on voltage (high voltage) during the compensation period, the fifth transistor T5 may be turned off during the compensation period by applying the first emission signal EM1 as a gate-off voltage (low level voltage).

All other operations may be the same as in the embodiments of FIG. 27 and FIG. 28.

Hereinafter, another modification of the embodiments illustrated with respect to FIG. 27 will be described with reference to FIG. 31 and FIG. 32.

Figure 31:
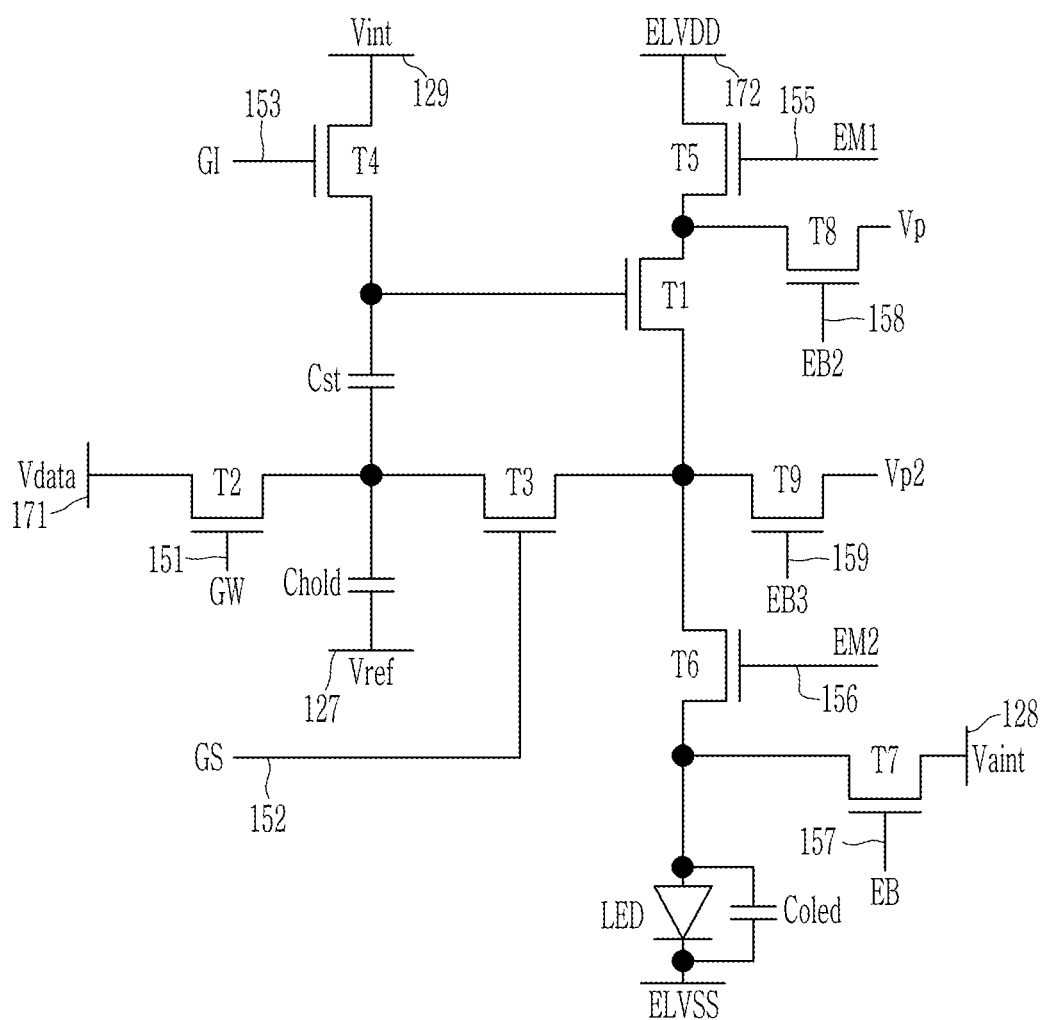
FIG. 31 and FIG. 32 each illustrate an equivalent circuit diagram of a pixel included in an emissive display device according to some embodiments.
Figure 32:
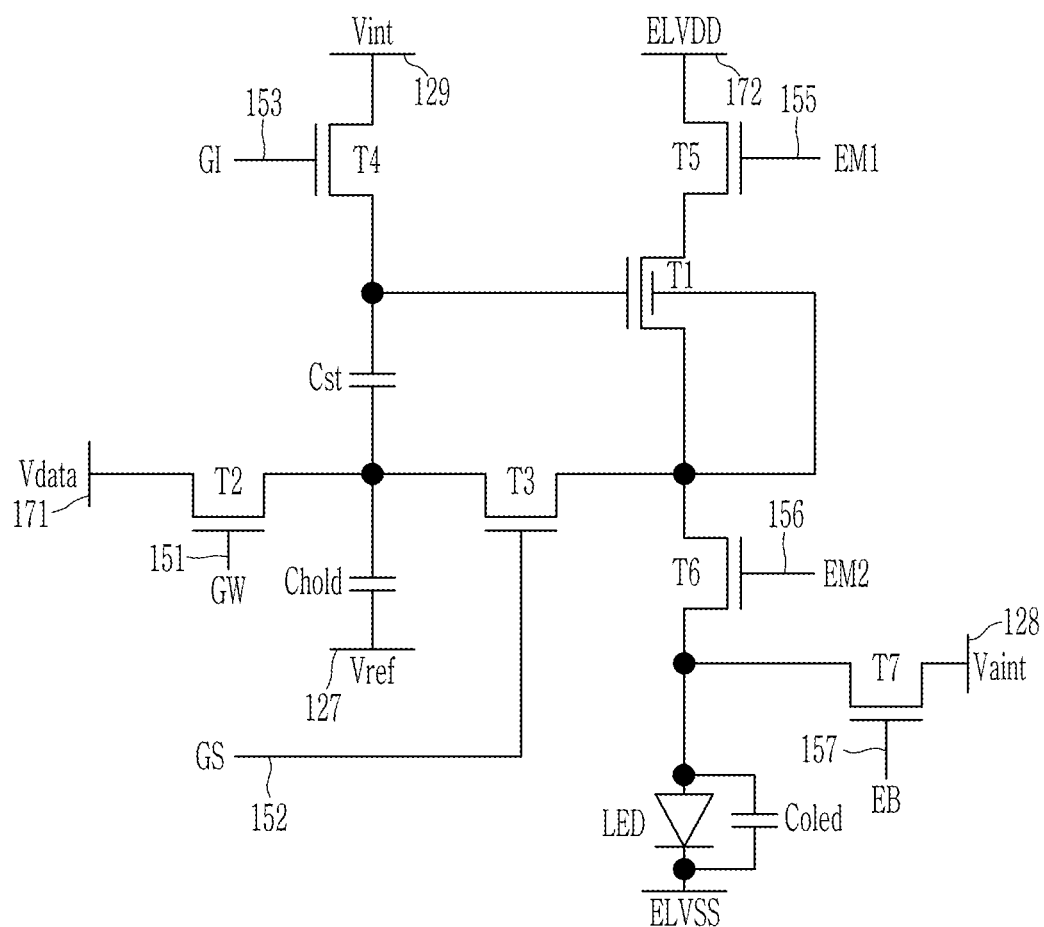

FIG. 31 and FIG. 32 each illustrate an equivalent circuit diagram of a pixel included in an emissive display device according to some embodiments.

The pixel according to the embodiments illustrated with respect to FIG. 31, which further includes the ninth transistor T9 in addition to the pixel of FIG. 29, further includes the eighth transistor T8 and the ninth transistor T9 compared to the pixel of FIG. 27. Meanwhile, in the embodiments illustrated with respect to FIG. 31, as illustrated in FIG. 29, the fifth transistor T5 and the sixth transistor T6 respectively receive the first emission signal EM1 and the second emission signal EM2, but according to some embodiments, the fifth transistor T5 and the sixth transistor T6 may be connected to a same emission control line and controlled by a same light emission signal.

In the embodiments illustrated with respect to FIG. 31, the ninth transistor T9 is an n-type transistor, and may include an oxide semiconductor as a semiconductor layer. The ninth transistor T9 transfers a second bias voltage Vp2 to the second electrode of the driving transistor T1. Hereinafter, the ninth transistor T9 is also referred to as a second bias transistor. The gate electrode of the ninth transistor T9 is connected to the sixth scan line 159 to receive the sixth scan signal EB3, the first electrode of the ninth transistor T9 receives the second bias voltage Vp2, and the second electrode of the ninth transistor T9 is connected to the second electrode of the driving transistor T1 and the first electrode of the sixth transistor T5.

The ninth transistor T9 is turned on to initialize the voltage of the second electrode of the driving transistor T1 by changing the voltage of the second electrode of the driving transistor T1 to the second bias voltage Vp2. Timing at which the ninth transistor T9 is turned on may vary, and particularly, when low frequency driving is performed, it may be turned on together with the eighth transistor T8 to allow the driving transistor T1 to generate an output current for a long time by using one data voltage Vdata input through the second transistor T2.

Meanwhile, compared to the pixel of FIG. 27, the pixel according to the embodiments illustrated with respect to FIG. 32 has a structure in which the driving transistor T1 further includes an additional gate electrode connected to the second electrode of the driving transistor T1. In this case, an additional gate electrode overlapping the channel 1132 of the driving transistor T1 is further formed, and the additional gate electrode may have a structure that is connected to the second electrode of the driving transistor T1.

The pixel according to the embodiments illustrated with respect to FIG. 32 has the same signal as that of the pixel of FIG. 27, the waveform diagram applied to the pixel of FIG. 32 may be the same as that of FIG. 28, and a same operation as that of the pixel of FIG. 27 may be performed.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims, and their equivalents.

| Description of Some of the Reference Symbols | |
|---|---|
| LED: light emitting diode | Cst: storage capacitor |
| T1, T2, T3, T4, T5, T6, T7, T8, T9: transistor | |
| Chold: hold capacitor | Coled: diode capacitor |
| 171: data line | 172, 172-1: driving voltage line |
| 127: reference voltage line | 128: initialization voltage line |
| 129: second initialization voltage line | 151: first scan line |
| 152: second scan line | 153: third scan line |
| 155: first emission control line | 156: second emission control line |
| 157: fourth scan line | 158: fifth scan line |
| 159: sixth scan line | 110: substrate |
| 1131, 1132, 1133, 1134, 1135, 1136: first semiconductor layer | |
| 1151: gate electrode of driving transistor | |
| 1152, 1252: opening | 1153: first storage electrode |
| 1253: second electrode of hold capacitor | |
| 3300, 3400, 3700: oxide semiconductor layer | |
| 152a: lower second scan line | 153a, 157a: lower sealing portion |
| 155a: gate electrode of fifth transistor | 172e: extension |
| ACM1, ACM2: diode connecting member | |
| SD13, SD14, SD155, SD2, SD3, SD4, SD44, SD5, SD67: connecting member | |
| 141, 142, 143: gate insulating layer | 161, 162: interlayer insulating layer |
| 181, 182, 183: organic layer | 380: pixel defining layer |
| 385: spacer | 400: encapsulation layer |
| EML: emission layer | FL: functional layer |

What is claimed is:

1. An emissive display device comprising:
   a light emitting diode;
   a driving transistor configured to output an output current to the light emitting diode, the driving transistor being p-type and comprising a gate electrode, a first electrode, and a second electrode;
   a second transistor that is p-type and comprising a gate electrode, a first electrode, and a second electrode, wherein the second transistor is configured to be activated in response to a first scan signal;
   a third transistor that is n-type and comprising a gate electrode, a first electrode, and a second electrode, wherein the third transistor is configured to be activated in response to a second scan signal;
   a storage capacitor comprising a first electrode and a second electrode;
   a fourth transistor comprising a first electrode and a second electrode coupled to the storage capacitor and the driving transistor, the fourth transistor being configured to be activated in response to a third scan signal that is offset in time and has a different duration time of a high-level voltage from the second scan signal;
   a hold capacitor comprising a first electrode and a second electrode;
   a first scan line transmitting the first scan signal; and
   a second scan line transmitting the second scan signal,
   wherein the second electrode of the third transistor is connected to the first electrode of the driving transistor,
   the first electrode of the second transistor is configured to receive a data voltage, and
   the second electrode of the second transistor is connected to the first electrode of the third transistor, the first electrode of the storage capacitor, and the second electrode of the hold capacitor,
   the first scan line and the gate electrode of the second transistor are integrally formed,
   the second scan line and the gate electrode of the third transistor are integrally formed, and
   the first scan line and the second scan line are disposed on different layers.

2. The emissive display device of claim 1, further comprising:
   a fifth transistor that is p-type and comprising a gate electrode, a first electrode, and a second electrode,
   wherein the fourth transistor is n-type and the second electrode of the fourth transistor is connected to the gate electrode of the driving transistor and the second electrode of the storage capacitor, and
   the second electrode of the fifth transistor is connected to the first electrode of the driving transistor and the second electrode of the third transistor.

3. The emissive display device of claim 2, further comprising:
   a sixth transistor that is p-type and comprising a gate electrode, a first electrode, and a second electrode, wherein the first electrode of the sixth transistor is connected to the second electrode of the driving transistor.

4. The emissive display device of claim 2, further comprising:
a seventh transistor comprising a gate electrode, a first electrode, and a second electrode,
wherein the second electrode of the seventh transistor is connected to one electrode of the light emitting diode.

5. The emissive display device of claim 4, further comprising:
an eighth transistor comprising a gate electrode, a first electrode, and a second electrode,
wherein the second electrode of the eighth transistor is connected to the first electrode of the driving transistor and the second electrode of the third transistor.

6. The emissive display device of claim 4, further comprising
a ninth transistor comprising a gate electrode, a first electrode, and a second electrode,
wherein the second electrode of the ninth transistor is connected to the second electrode of the driving transistor.

7. The emissive display device of claim 1, wherein
the driving transistor further includes an additional gate electrode, and the additional gate electrode of the driving transistor is connected to the first electrode of the driving transistor.

8. An emissive display device comprising:
a light emitting diode;
a driving transistor configured to output an output current to the light emitting diode, the driving transistor being n-type and comprising a gate electrode, a first electrode, and a second electrode;
a second transistor that is n-type and comprising a gate electrode, a first electrode, and a second electrode, wherein the second transistor is configured to be activated in response to a first scan signal;
a third transistor that is n-type and comprising a gate electrode, a first electrode, and a second electrode, wherein the third transistor is configured to be activated in response to a second scan signal;
a storage capacitor comprising a first electrode and a second electrode;
a fourth transistor comprising a first electrode and a second electrode coupled to the storage capacitor and the driving transistor, the fourth transistor being configured to be activated in response to a third scan signal that is offset in time and has a different duration time of a high-level voltage from the second scan signal;
a hold capacitor comprising a first electrode and a second electrode;
a first scan line transmitting the first scan signal; and
a second scan line transmitting the second scan signal,
wherein the second electrode of the third transistor is connected to the second electrode of the driving transistor,
the first electrode of the second transistor is configured to receive a data voltage, and
the second electrode of the second transistor is connected to the first electrode of the third transistor, the first electrode of the storage capacitor, and the second electrode of the hold capacitor,
the first scan line and the gate electrode of the second transistor are integrally formed,
the second scan line and the gate electrode of the third transistor are integrally formed, and
the first scan line and the second scan line are disposed on different layers.

9. The emissive display device of claim 8, further comprising:
wherein the fourth transistor is n-type and the second electrode of the fourth transistor is connected to the gate electrode of the driving transistor and the second electrode of the storage capacitor.

10. The emissive display device of claim 9, further comprising:
a fifth transistor that is n-type and comprising a gate electrode, a first electrode, and a second electrode; and
a sixth transistor that is n-type and comprising a gate electrode, a first electrode, and a second electrode,
wherein the second electrode of the fifth transistor is connected to the first electrode of the driving transistor, and
the first electrode of the sixth transistor is connected to the second electrode of the driving transistor and the second electrode of the third transistor.

11. The emissive display device of claim 10, further comprising
a seventh transistor comprising a gate electrode, a first electrode, and a second electrode,
wherein the second electrode of the seventh transistor is connected to one electrode of the light emitting diode.

12. The emissive display device of claim 10, further comprising
an eighth transistor comprising a gate electrode, a first electrode, and a second electrode,
wherein the second electrode of the eighth transistor is connected to the first electrode of the driving transistor.

13. The emissive display device of claim 10, further comprising
a ninth transistor comprising a gate electrode, a first electrode, and a second electrode,
wherein the second electrode of the ninth transistor is connected to the second electrode of the driving transistor and the second electrode of the third transistor.

14. The emissive display device of claim 8, wherein
the driving transistor further includes an additional gate electrode, and the additional gate electrode of the driving transistor is connected to the second electrode of the driving transistor.

15. An emissive display device comprising:
a substrate;
a first semiconductor layer on the substrate and comprising a first portion including a semiconductor of a driving transistor and a second portion separated from the first portion and including a semiconductor of a second transistor;
a first gate insulating layer on the first semiconductor layer;
a first gate conductive layer on the first gate insulating layer and comprising a gate electrode of the driving transistor and a gate electrode of the second transistor;
a second gate insulating layer on the first gate conductive layer;
a second gate conductive layer on the second gate insulating layer and comprising a first storage electrode overlapping the gate electrode of the driving transistor, and a driving voltage line including an extension;
a first interlayer insulating layer on the second gate conductive layer;
a second semiconductor layer on the first interlayer insulating layer and comprising a semiconductor of a third transistor and a second electrode of a hold capacitor overlapping the extension of the driving voltage line;

a third gate insulating layer on the second semiconductor layer;

a third gate conductive layer on the third gate insulating layer and comprising a gate electrode of the third transistor;

a second interlayer insulating layer on the third gate conductive layer; and a first data conductive layer on the second interlayer insulating layer and comprising a first node connecting member and a semiconductor layer connecting member, wherein a first end of the first portion of the first semiconductor layer and a first end of the second semiconductor layer are connected to each other by the semiconductor layer connecting member, and a second end of the second semiconductor layer and a first end of the second portion of the first semiconductor layer are connected to each other by the first node connecting member.

16. The emissive display device of claim 15, wherein the first node connecting member is also connected to the first storage electrode and the second electrode of the hold capacitor.

17. The emissive display device of claim 16, wherein the second semiconductor layer further includes a semiconductor of a fourth transistor, the third gate conductive layer further includes a gate electrode of the fourth transistor, and the first storage electrode has an opening, and the gate electrode of the driving transistor is connected to the semiconductor of the fourth transistor through the opening of the first storage electrode.

18. The emissive display device of claim 17, wherein the first portion of the first semiconductor layer further includes a semiconductor of a fifth transistor and a semiconductor of a sixth transistor, the first gate conductive layer further includes a gate electrode of the fifth transistor and a gate electrode of the sixth transistor, and the first data conductive layer further includes a driving voltage connecting member, wherein the second electrode of the hold capacitor has an opening, and the extension of the driving voltage line is connected to the semiconductor of the fifth transistor through the driving voltage connecting member through the opening of the second electrode of the hold capacitor.

19. The emissive display device of claim 18, wherein the second semiconductor layer further includes a semiconductor of a seventh transistor, the third gate conductive layer further includes a gate electrode of the seventh transistor, and the semiconductor of the seventh transistor is connected to the semiconductor of the sixth transistor.

20. The emissive display device of claim 18, further comprising:

a first organic layer on the first data conductive layer; and a second data conductive layer on the first organic layer and configured to include a vertical driving voltage line and a data line, wherein the vertical driving voltage line is connected to the driving voltage connecting member, and the data line is connected to the semiconductor of the second transistor.

* * * * *